(12) United States Patent
Zimmerman et al.

(10) Patent No.: US 7,504,192 B2
(45) Date of Patent: Mar. 17, 2009

(54) SOFT PELLICLE FOR 157 AND 193 NM AND METHOD OF MAKING SAME

(75) Inventors: Paul A. Zimmerman, Cedar Creek, TX (US); Chris K. Van Peski, Cedar Creek, TX (US)

(73) Assignee: Sematech Inc., Austin, TX (US)

( * ) Notice: Subject to any disclaimer, the term of this patent is extended or adjusted under 35 U.S.C. 154(b) by 449 days.

(21) Appl. No.: 11/015,590

(22) Filed: Dec. 17, 2004

(65) Prior Publication Data

US 2005/0214655 A1 Sep. 29, 2005

Related U.S. Application Data

(60) Provisional application No. 60/531,184, filed on Dec. 19, 2003.

(51) Int. Cl.
*G03F 7/00* (2006.01)
*G03F 7/004* (2006.01)

(52) U.S. Cl. .................................... 430/270.1

(58) Field of Classification Search ............... 430/270.1
See application file for complete search history.

(56) References Cited

U.S. PATENT DOCUMENTS

| | | | | |
|---|---|---|---|---|
| 5,168,001 A | * | 12/1992 | Legare et al. | 428/194 |
| 5,344,677 A | * | 9/1994 | Hong | 428/14 |
| 5,492,587 A | * | 2/1996 | Hong | 156/246 |
| 6,594,073 B2 | * | 7/2003 | Wang | 359/350 |
| 6,660,346 B2 | * | 12/2003 | Matsukura et al. | 428/14 |
| 6,720,116 B1 | * | 4/2004 | Tzu et al. | 430/5 |
| 7,022,437 B2 | * | 4/2006 | Cummings | 430/5 |
| 7,029,800 B2 | * | 4/2006 | Su et al. | 430/5 |
| 7,214,452 B2 | * | 5/2007 | Powers et al. | 430/5 |

FOREIGN PATENT DOCUMENTS

| | | | | |
|---|---|---|---|---|
| JP | 06003808 A | * | 1/1994 |
| JP | 08123013 A | * | 5/1996 |
| JP | 2000305255 A | * | 11/2000 |
| JP | 2001109132 A | * | 4/2001 |
| JP | 2001222100 A | * | 8/2001 |
| JP | 2001249441 A | * | 9/2001 |

OTHER PUBLICATIONS

Aecella et al., "High Performance Pefluoropolymer Films and Membranes", Annuals of the eNew York Academy of Sciences,984:226-244 (May 2003).*

Chapiro, In: *Radiation chemistry of polymer systems*, InterScience (London), 1962.

Feiring et al., "Design of very transparent fluoropolymer resists for semiconductor manufacture at 157 nm," *J. Fluorine Chem.* 122, 63 2003.

(Continued)

*Primary Examiner*—Amanda C. Walke
(74) *Attorney, Agent, or Firm*—Fulbright & Jaworski L.L.P.

(57) ABSTRACT

The present invention relates generally to the fields of semiconductor lithography. More particularly, it concerns methods, compositions, and apparatuses relating to 157 nm and 193 nm soft pellicles and the use of perfluorinated polymers in the creation of pellicles.

4 Claims, 22 Drawing Sheets

OTHER PUBLICATIONS

Fischer et al., "Fti.r. spectroscopy on electron irradiated polytetrafluoroethylene," *Polymer*, 39:573, 1998.

Franklin, "Energy-saving lubricants containing colloidal PTFE," *J. Am. Chem. Soc. Lubricat. Engng.*, 38:635, 1982.

Katoh et al., " Evidence for radiation induced crosslinking in plytetrafluoroethylene by means of high-resolution solid-state $^{19}$F high-speed MAS NMR," *Radiat. Phys. Chem.*, 54:165-171, 1999.

Kuo, L.Tewg, P.A. Zimmerman, Proc of SPIE, 23rd Annual BACUS Symposium on Photomask Technology, 5256, 195, (2003).

Lappan et al., "Changes in the chemical structure of polytetrafluoroethylene induced by electron beam irradiation in the molten state," *Radiation Physics and Chemistry*, 59:317-322, 2000.

Lappan et al., "Radiation-induced branching and crosslinking of poly(tetrafuoroethylen) (PTFE)," *Nuclear Instruments and Methods in Physics Research B*, 185:178-183, 2001.

Lappan et al., " Radation-induced branching and crosslinking of poly(tetrafluoroethylene) (PTFE)", *Nucl. Inst. and Methods in Physics Res. B* 185, 2001.

Liberman et al. "Improved pellicles for 157 nm-lithography-A nanocoposite approach," 4th International Symposium on 157nm Lithography in Yokohama, Aug. 27, 2003.

Liberman, et al. "Long-term laser durability testing of optical coatings and thin films for 157-nm lithography," *Optical Microlithography XV, SPIE* 4691:568-574, 2002.

Lovejoy et al., "Chemistry of radiation crosslinking of branched fluorocarbon resins," *Journal of Applied Polymer Science*, 9:401-410, 1965.

Luzinov, et al., "Nanoparticle Stabilization of Polymer Pellicles in 157 nm Photolithography", International Symposium on Immersion and 157nm Lithography Aug. 2-5, 2004 Vancouver, British Columbia.

Matsukura, et al. "Improvement of the membrane durability of polymeric pellicles," 3rd International Symposium on 157nm Lithography in Antwerp, Sep. 6, 2002.

O'Donnell et al., Principles of Radiation Chemistry, American Elsevier Publishing Company, New York, 1970, p. 166.

Oshima et al., "Chemical structure and physical properties of radiation-induced crosslinking of polytetrafluoroethylene," *Radiation Physics and Chemistry*, 62:39-45, 2001.

Oshima et al., "Radiation-induced free radicals and their behavior in crosslinked polytetrafluoroethylene (PTFE)," *Polym. Int.*, 48:996-1003, 1999a.

Oshima et al., "ESR study on free radicals trapped in cross linked polytetrafluoroethylene (PTFE)—II radical formation and reactivity," *Polym. Int.*, 55:61-71, 1999b.

Oshima et al., "Radiation induced crosslinking of polytetrafluoroethylene," *Radiat. Phys. Chem.*, 45:269-273, 1995.

Oshima et al., "Temperature effect on radiation induced reactions in ethylene and tetraflouroethylene copolymer (ETFE)," *Radiat. Phys. Chem.*, 50:519-522, 1997a.

Oshima et al., "ESR study on free radicals trapped in crosslinked polytetrafluoroethylene (PTFE)" *Radiat. Phys. Chem.*, 50:601-606, 1997c.

Oshima et al., "Temperature effects on radiation induced phenomena in polytetrafluoroetylene (PTFE)—change of g-value," *Radiat. Phys. Chem.*, 50:611-615, 1997b.

Senna et al, "Structure—property behaviour of electon beam irradiated polytetrafluoroethylene and polytetrafluoroethylene-co-hexafluoropropylene," *Polym. Degrad. Stability*, 71:53-60, 2000.

Senna et al., "Structure-property behaviour of electron beam irradiated polytetrafluoroethylene and polytetrafluoroethylene-co-hexafluoropropylene," *Polymer Degradation and Stability*, 71:53-60, 2001.

Sun et al., "Modification of polytetrafluoroethylene by radiation-1 improvement in high temperature properties and radiation stability," *Radiat. Phys. Chem.*, 44:655-659, 1994.

Tabata et al. "Temperature dependence of radiation effects on polymers," *Macromol. Symp.*, 143:337-358, 1999.

Tabata et al., "Temperature effects on radiation induced phenomena in polymers," *Radiat. Phys. Chem.*, 48:563-568, 1996.

Tregub, et al., "Development of Fluoropolymer Membranes Transparent and Resistant to 157 nm Exposure", 4th International Symposium on 157nm Lithography in Yokohama, Aug. 27,2003.

Vypiel,"Praparative fluorierungen mit molekularem fluor," *Chimia*, 39:305-311, 1985 (no translation available).

Woods and Pikaev, In: *Applied radiation chemistry and radiation processing*, Wiley & Sons, Inc., NY, 1994.

Yoshi et al., "Durability of radiation-sterilized polymers: Radiation resistance of high molecular weight polypropylene," *Polym. Commun.*, 28:278, 1987.

Zimmerman, D. Miller, G. Feit, A. Whittaker, D. Hill, F. Rasoul, H. Liu, I. Blakely, G. George, N.J.Turro, K. Lee, S. Jockusch, A. Proctor, C. Garza, R.H. French and R.C. Wheland 4th International Symposium on 157nm Lithography in Yokohama, Aug. 27, 2003.

* cited by examiner

Polytetrafluoroethylene (PTFE)

Fluorinated ethylenepropylene (FEP)

Perfluoroisobutlyene-co-tetrafluoroethylene

Perfluoroalkoxyalkane (PFA)

This group could be C1 through C6 with 2n+1 fluorine

SOFT PELLICLE FOR 157 AND 193 NM AND METHOD OF MAKING SAME

This application claims the benefit of U.S. Provisional Application Ser. No. 60/531,184 filed Dec. 19, 2003, the entire disclosure of which is specifically incorporated herein by reference.

BACKGROUND OF THE INVENTION

1. Technical Field of the Invention

The present invention relates generally to the fields of semiconductor lithography. More particularly, it concerns methods, compositions, and apparatuses relating to 157 nm and 193 nm soft pellicles.

2. Description of Related Art

In the production of semiconductor devices there are a number of lithographic exposure steps whereby an image is projected onto a photosensitive material coating on a semiconductor wafer. The image is projected using a photomask which must be kept clean because any undesired particles on the surface may alter the image on the wafer and cause a defect.

A common method to achieve this goal has been the application of a protective membrane, which is separated by a few millimeters from the mask itself. At this offset, particles on the protective membrane will be out of focus and not imaged onto the wafer. This membrane, called a "pellicle," has been an integral part of the common practice in the semiconductor industry for two decades. The pellicle typically comprises a polymer membrane approximately one micrometer thick that is stretched over a frame which is affixed to a mask, also referred to as a "reticle." Although the pellicle is in the optical path, the polymer thickness is small so that effect on the imaging performance is negligible.

Currently, there is no mask protection solution available for 157 nm lithography. The expectation is that any solution will be expensive and would likely add difficulty to the lithography process. The creation of a soft pellicle solution for 157 nm lithography would provide immense benefit to semiconductor manufactures by improving the yields and reducing the cost of 157 nm lithography.

Additionally, there are limited choices for 193 nm pellicles, raising the cost of the lithography. Improvements in 193 nm pellicles would provide benefit for semiconductor manufactures by reducing the costs of 193 nm lithography. All semiconductor manufactures and tool suppliers in the semiconductor industry would prefer a soft pellicle solution over a hard pellicle solution.

SUMMARY OF THE INVENTION

No pellicle solution currently exists in the prior art for 157 nm semiconductor lithography. The present invention overcomes these deficiencies by providing methods, materials, and apparatuses for soft pellicles for 157 nm lithography. Additionally the soft pellicles may be used for 193 nm semiconductor lithography. The soft pellicles of the present invention are made using perfluorinated polymers that have, in an exemplary embodiment, been irradiated with a high energy electron beam and fluorinated to increase the transparency of the perfluorinated polymer.

In one aspect of the present invention a method is provided for producing a pellicle comprising exposing a perfluorinated polymer to radiation. The perfluorinated polymer may then, in an exemplary embodiment, be exposed to fluorination. In another embodiment, the temperature of the perfluorinated polymer is controlled. This method may comprise heating the perfluorinated polymer to a temperature of at least the melting temperature of the perfluorinated polymer. This method may further comprise heating the perfluorinated polymer above the melting temperature of the perfluorinated polymer. The temperature of the perfluorinated polymer may range from between about 20° C. to about 400° C., more preferably from between about 320° C. and about 385° C. In this method, the irradiation may comprise a high energy electron beam, preferably from about 800 kGy to about 10 MGy. In an exemplary embodiment, the irradiation occurs in an oxygen-free environment such as in a vacuum or in an environment that contains a noble gas. The noble gas in one exemplary embodiment is argon but may also be helium, neon, krypton, xenon, or radon. The perfluorinated polymer may be exposed to fluorination at least once, and, in one exemplary embodiment, the fluorination comprises exhaustive fluorination.

The perfluorinated polymer comprises in preferred embodiments PTFE, FEP, PFA, and/or polytetraflurorethylene co-perfluoroisobutylene. In preferred embodiments, the perfluorinated polymer has a thickness of less than 100 microns, more preferably less than about 50 microns, more preferably less than about 40 microns, more preferably less than about 30 microns, more preferably less than about 25 microns. In one embodiment, the transparency of the perfluorinated polymer is increased by the irradiation and the fluorination. In exemplary embodiments, the pellicle comprises a pellicle for use with 157 nm lithography and/or 193 nm lithography.

The present invention also provides a pellicle comprising a perfluorinated polymer. In exemplary embodiments, the perfluorinated polymer has a thickness of less than 100 microns, more preferably less than about 50 microns, more preferably less than about 40 microns, more preferably less than about 30 microns, more preferably less than about 25 microns. The perfluorinated polymer may be PTFE, FEP, PFA, and/or polytetraflurorethylene co-perfluoroisobutylene. In certain embodiments, the perfluorinated polymer is irradiated and/or fluorinated. In one embodiment, irradiation comprises a high energy electron beam that is between from about 800 kGy to about 10 MGy. In exemplary embodiments, the pellicle comprises a pellicle for use with 157 run lithography and/or 193 nm lithography.

In another embodiment, the temperature of the perfluorinated polymer is controlled (e.g., controlled during irradiation). The perfluorinated polymer may be heated to a temperature of equal to or greater than the melting temperature of the perfluorinated polymer. In an exemplary embodiment, the irradiation occurs in an oxygen-free environment such as a vacuum or an environment that contains a noble gas. The noble gas may be argon but may also be helium, neon, krypton, xenon, or radon. The perfluorinated polymer may be exposed to fluorination at least once, and, in one embodiment, the fluorination comprises exhaustive fluorination. The fluorination and the irradiation preferably increase the transparency of the perfluorinated polymer.

The present invention also provides a system, comprising: a) a chamber for irradiation and fluorination of a sample, b) a window coupled to the chamber, the window allowing the irradiation of the sample, c) at least one aperture allowing for the passage of a gas d) a source of fluorination, and e) a radiation source. The chamber is preferably coupled to at least one pressure release valve. The chamber is preferably coupled to at least one heating unit for heating the chamber. The heating unit may allow for regulation of the chamber temperature between from about 20° C. and about 400° C., and the temperature is preferably regulated between from about 320° C. and about 385° C. The sample may comprise a perfluorinated polymer. The irradiation preferably comprises a high energy electron beam. The chamber may be coupled to two apertures. The chamber may also be coupled to two release valves. The window may comprise a replaceable window, including but not limited to a Ti window and an Al window. In a preferred embodiment, the Ti window is about 32 microns thick.

The use of the word "a" or "an" when used in conjunction with the term "comprising" in the claims and/or the specification may mean "one," but it is also consistent with the meaning of "one or more," "at least one," and "one or more than one." As used herein "another" may mean at least a second or more.

It is contemplated that any embodiment discussed in this specification can be implemented with respect to any method or composition of the invention, and vice versa. Furthermore, compositions of the invention can be used to achieve the methods of the invention.

Throughout this application, the term "about" is used to indicate that a value includes the inherent variation of error for the device, the method being employed to determine the value, or the variation that exists among the study subjects.

The use of the term "or" in the claims is used to mean "and/or" unless explicitly indicated to refer to alternatives only or the alternatives are mutually exclusive.

As used in this specification and claim(s), the words "comprising" (and any form of comprising, such as "comprise" and "comprises"), "having" (and any form of having, such as "have" and "has"), "including" (and any form of including, such as "includes" and "include"), or "containing" (and any form of containing, such as "contains" and "contain") are inclusive or open-ended and do not exclude additional, unrecited elements or method steps.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

The present invention overcomes deficiencies in the prior art by providing compositions, methods, and apparatuses for novel soft pellicles that can be used for both 157 nm and 193 nm lithography. Because a soft pellicle solution for 157 nm lithography does not exist in the prior art, the creation of a soft pellicle solution for 157 nm lithography described herein provides immense benefit to semiconductor manufactures. Additionally, the soft pellicles described herein also provide significant benefit to semiconductor manufactures by lowering the costs of 193 nm lithography. In one embodiment, the present invention relates to a method comprising the use of perfluorinated polymers to produce soft pellicles. In another embodiment, the present invention relates to an apparatus and a system for producing soft pellicles. In yet another embodiment, the present invention relates to soft pellicles for 157 nm lithography.

A. Perfluorinated Polymers

Figure 2:
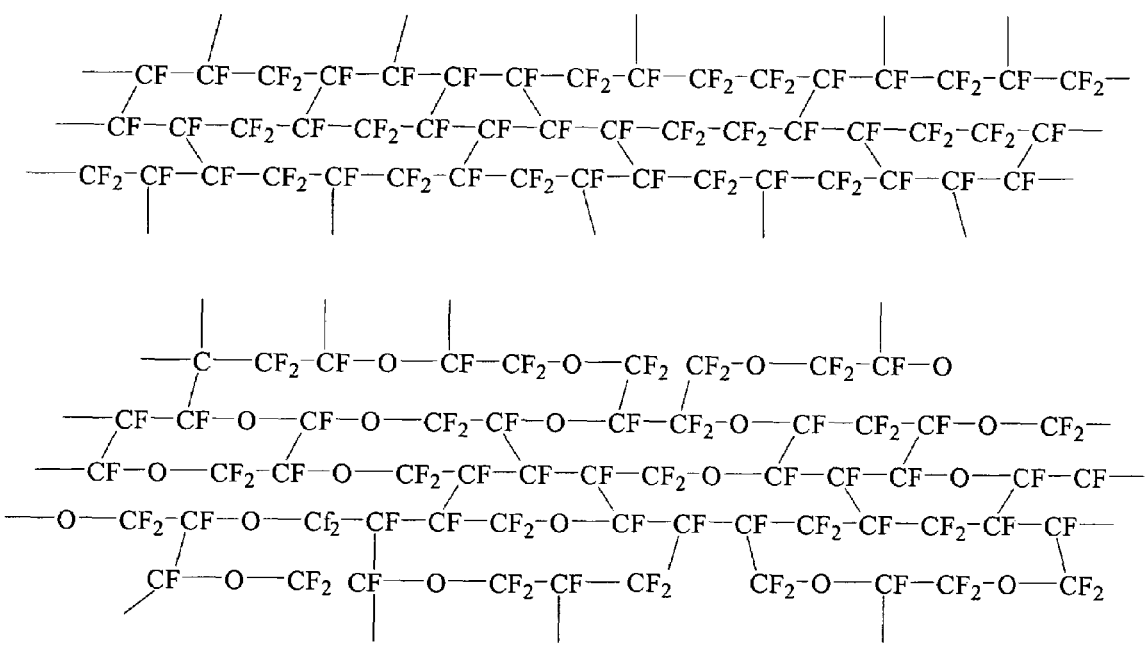
FIG. 2: presents examples of perfluorinated polymers in accordance with aspects of the invention.
Figure 4:
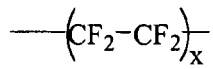
FIG. 4: presents examples of perfluorinated polymers in accordance with aspects of the invention.
Figure 4:
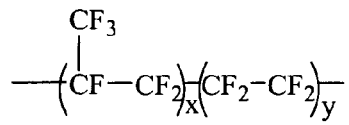
Figure 4:
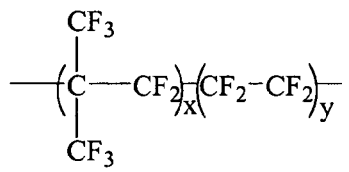
Figure 4:
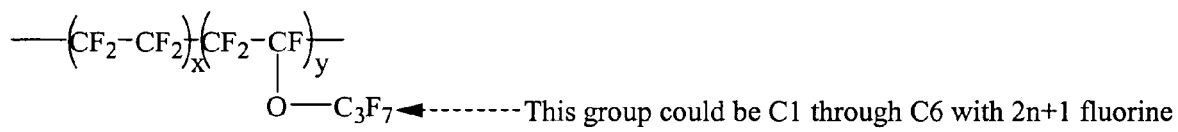
Figure 4:
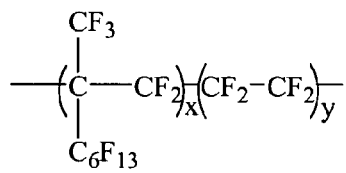

As used herein "perfluorinated polymers" include any compound that is composed substantially of carbon and fluorine and any compound that is composed substantially of carbon, fluorine, and oxygen. Examples of perfluorinated polymers include: polytetrafluoroethylene (PTFE), polytetrafluoroethylene-co-hexafluoropropene (FEP), polytetraflurorethylene co-perfluoroisobutylene, and polytetrafloroethylene co-perfluoroalkoxy (PFA). Examples of perfluorinated polymers are shown in FIG. 2 and FIG. 4. As shown in FIG. 4, X and Y each independently represent integers that can be as low as 1 but can be as high as about 1000 or higher depending on the exact structure of the perfluorinated polymer. Perfluorinated polymers also include fluorinated polymers and fluorinated-polymeric materials.

Perfluorinated polymers include compositions that are composed essentially of any combination of perfluorinated polymers. For example, a perfluorinated polymer would include a material that is composed essentially of a combination of PTFE, FEP, and PFA; in this example, this perfluorinated polymer might be a single molecule that includes PTFE, FEP, and PFA moieties that are attached by molecular bonds; alternatively, in this example, the perfluorinated polymer might be a mixture or PTFE, FEP, and PFA.

Previous studies on perfluorinated polymers have been directed towards perfluorinated polymers that are 40-500 microns thick (Oshima et al., 2001; Lappan et al., 2001; Senna et al., 2001). Perfluorinated polymers of this thickness are not useful for pellicle applications. Although the inventors anticipate that perfluorinated polymers of various sizes will be used with the present invention, perfluorinated polymers of a thickness less than about 100 microns, more preferably less than about 50 microns, more preferably less than about 40 microns, more preferably less than about 30 microns, more preferably less than about 25 microns, more preferably less than about 20 microns are used with the present invention as soft pellicle materials for 157 and 193 nm pellicles.

Fluorinated polymers are engineering plastics that are widely used due to their mechanical properties, chemical inertness, heat resistance and low coefficient of friction (Fischer et al., 1998). Irradiation can change the physical and chemical properties of fluorinated polymers (Chapiro, 1962; Yoshi et al., 1987). The degree to which the radiation will affect the polymer depends on many factors, including the chemical structure, morphology, irradiation dose, and irradiation conditions (Franklin, 1982; El-Nemr et al., 1998; Woods et al., 1994). For example, temperature can affect the changes produced by irradiation on perfluorinated polymers (Tabata, 1992; Oshima et al., 1995, 1997a,b; Tabata et al., 1996; Tabata and Oshima, 1999; Ikeda et al., 2000; Katoh, 1999). Additionally, other conditions (e.g., the nature of any gasses in contact with the perfluorinated polymer) can also affect the changes produced in a perfluorinated polymer by irradiation (Lappan et al, 2000; Lovejoy et al., 1965; Oshima et al. 1997c, 1999a,b; Tabata and Oshima, 2000; Sun et al., 1994; Lappan et al. 2000b; Senna et al, 2000.)

B. Methods for Producing 157 nm and 193 nm Pellicles Using Perfluorinated Polymers The present invention presents and utilizes the idea that a highly cross-linked fluorocarbon material (i.e. a perfluorinated polymer) may be used as a pellicle for semiconductor manufacture. Novel methods have been used herein to remove crystallinity from perfluorinated polymers such as polytetrafluoroethylene (PTFE). This technology and these approaches will be applied to thin films of PTFE and other perfluorinated polymers.

The invention takes a very thin perfluorinated polymer film (preferably less than 50 microns thick, more preferably less than 25 microns thick) and uses a cross linking mechanism followed by fluorination to improve transparency and lifetime of the film, as compared to starting materials. The pellicle is created by first using an extremely thin (preferably less than 50 microns thick, more preferably less than 25 microns thick) layer of perfluorinated polymer that is heated above its melt temperature and irradiated with a high energy electron beam. Adjustments to the film's properties are completed by variation of temperature, radiation dose, pressure and gas type present near and/or contacting the perfluorinated polymer. These properties include: film thickness, cross-linking density, film uniformity, and degree of crystalinity.

The starting material may be mounted onto a frame (e.g., an aluminum frame) in a class 100-1000 clean room and then inserted into a chamber, sealed, and then pressurized to about 1.1 atmospheres with a noble gas (e.g., argon) preferably of high-purity. The temperature of the chamber may be varied from about 20° C. to about 400° C., but will generally be operated between about 320° C. and about 385° C. In one embodiment of the present invention, prior to heating of the chamber, the system is purged with high purity argon (or other noble gas) for about 30 minutes; in this embodiment, under a pressure of about 1.1 atmospheres of argon the system is heated to about 340° C. The pressure relief valve on the process chamber can be set to about 1.1 atm to prevent overpressurization as heating occurs. During the final heating stage where the system is at equilibrium, vacuum is applied to the system on the order of about 20 mtorr to about 100 mtorr.

Next, the perfluorinated polymer material can be exposed to high energy electrons. Exposure of the material can be carried out through a 32 micron Ti window on the chamber using high energy (e.g., about 1 MeV) electrons with a total dose of from about 800 kGy to about 10 MGy. A Gray (Gy) is a Joule per Kilogram. The samples may then be cooled slowly to about room temperature (e.g., over a period of about two to about four hours) while maintaining vacuum within the system. After the samples are fully cooled, high-purity argon (or other noble gas) can again be flushed through the system and a slight positive pressure (e.g., about 1.1 atm) can be maintained using a pressure relief valve.

During the electron beam irradiation procedure double bonds are introduced into the polymers. Fluorination, more preferably exhaustive fluorination, is used in this method to eliminate these double bonds and improve the transparency at 157 nm. This fluorination procedure may take place in the same chamber as used for the irradiation. The Ti window can be replaced by an Al window for this process. The substitution of the windows will preferably be done in a clean room. The basic fluorination process (i.e., "fluorination", "exposure to fluorination", or creating a "fluorinated" product) is described in detail in (Vypiel, 1985). In some embodiments of the present invention, once fluorination is completed, the membranes can then be remounted on frames for testing if necessary. In other embodiments of the present invention, remounting of the materials is not necessary and will not be performed.

This method provides several significant advantages. One advantage of this process over current materials is that the starting material is typically inexpensive and readily available from multiple sources. Additionally, the electron bombardment used in certain preferred embodiments is relatively inexpensive since the process typically requires short irradiation periods of about 100 seconds to about 200 seconds. In certain embodiments, 75 membranes/hr may be prepared making the process economically feasible. In certain embodiments, even with the fluorination process, the total estimated cost for pellicles described herein is significantly cheaper than current pellicle costs.

C. The Process Chamber

The process chamber (also referred to as the "polymer exposure system" apparatus or the "process chamber apparatus") allows direct modification of all materials as freestanding films. This process chamber allows for both irradiation and fluorination in the same chamber. Furthermore the process chamber apparatus allows for the introduction of gasses or vacuum, and, in a preferred embodiment, includes a pressure release valve.

Figure 5:
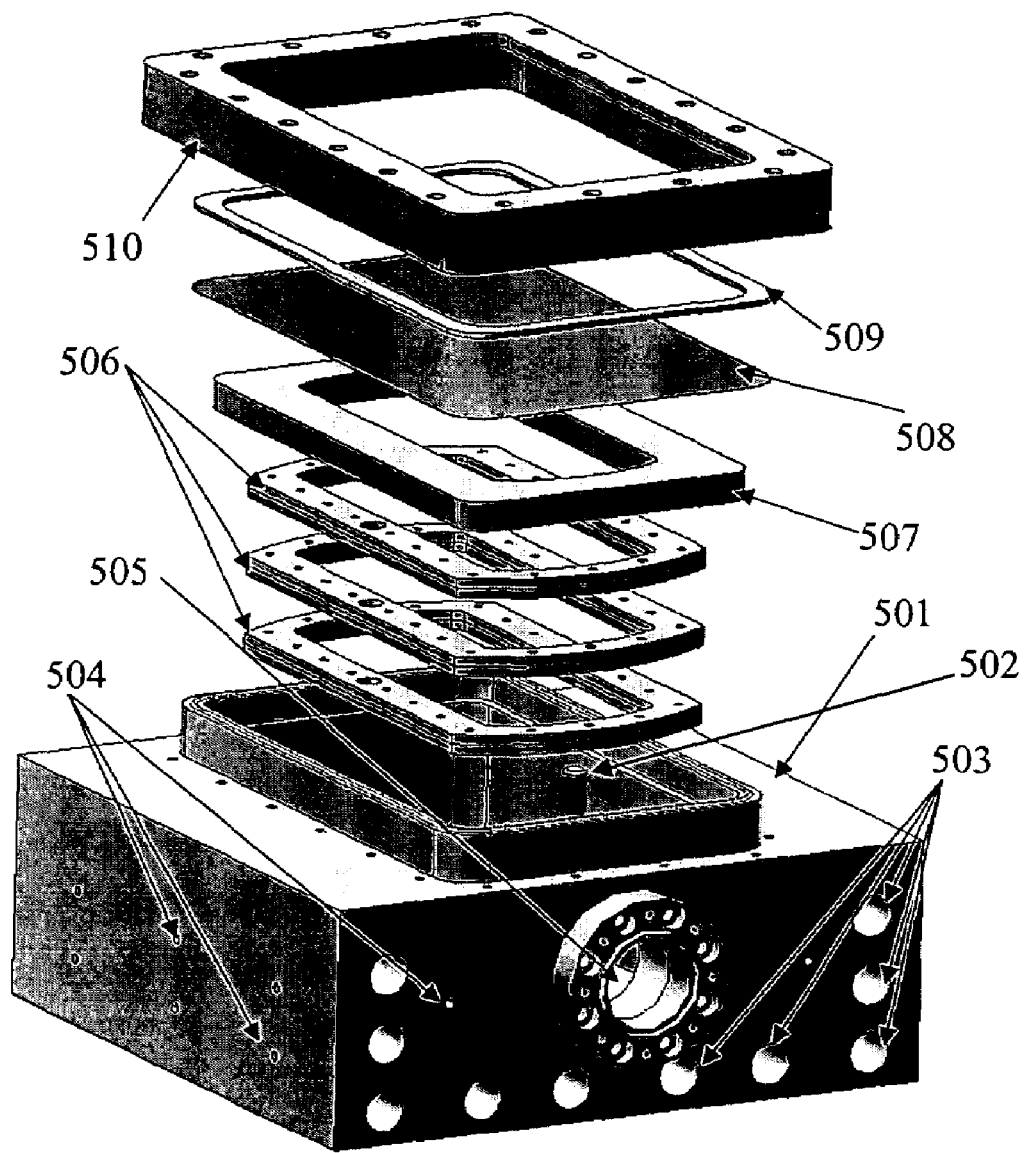
FIG. 5: is an exploded view of an embodiment of an irradiation chamber in accordance with aspects of the invention.
Figure 6:
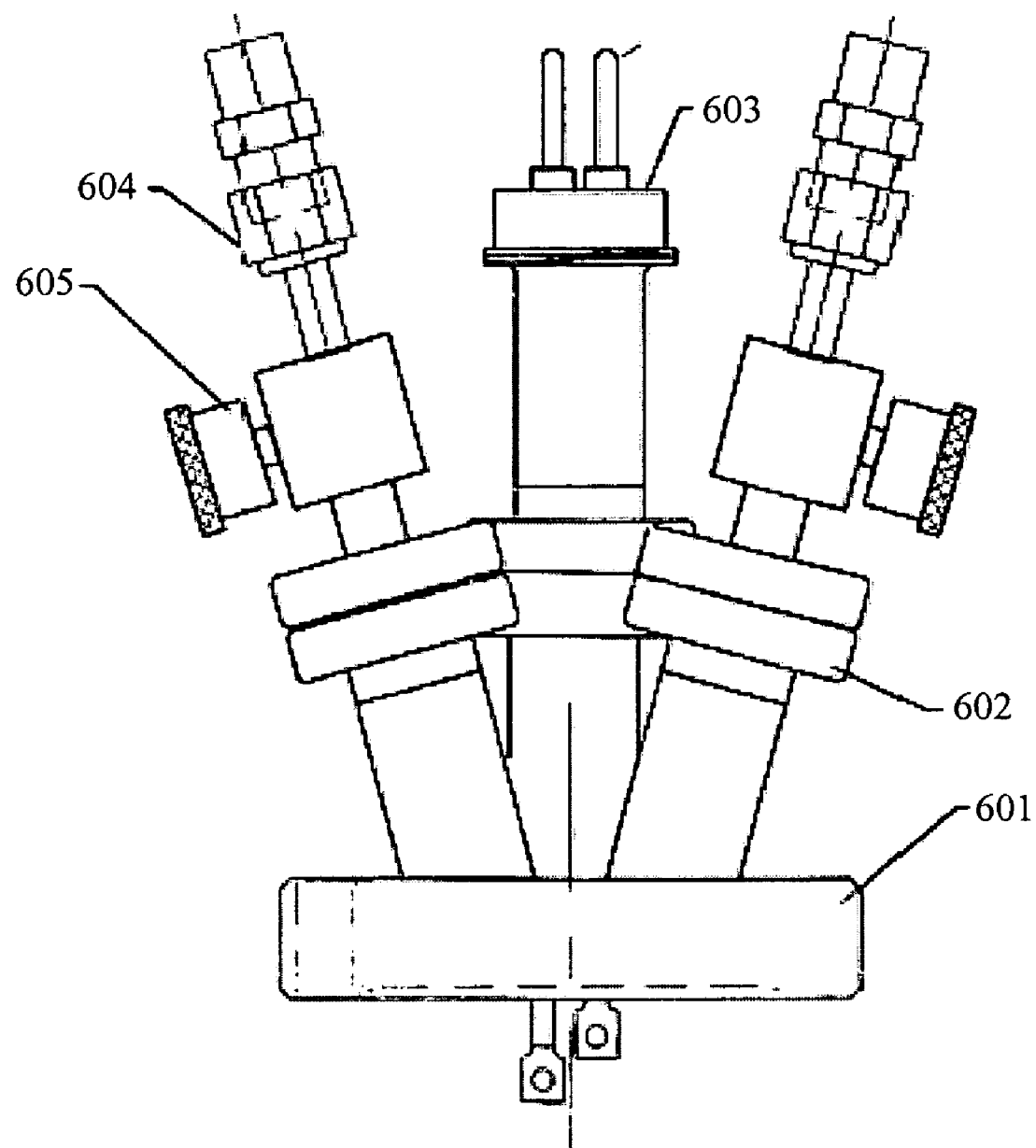
FIG. 6: is a feed through hat in accordance with aspects of the invention.

The process chamber apparatus comprises a chamber with at least one hole in it to allow for the exchange of gasses. In a preferred embodiment, the chamber possesses two holes for this purpose. This chamber either possesses a window or is coupled to a window through which irradiation can pass. In a preferred embodiment, the process chamber possesses a 32 micron Ti window on the chamber through which exposure of the perfluorinated polymer material to high energy (~1 MeV) electrons may be carried out. In a preferred embodiment, the Ti window can be replaced by an Al window for this process. The chamber also possesses an area suitable for the placement of a perfluorinated polymer. The chamber may also possess or may be coupled to at least one pressure release valve that allows for the control of the pressure in the chamber. The chamber may also possess or may also be coupled to at least one heating element that can be used to raise and/or lower the temperature of the chamber. FIG. 5 and FIG. 6 describes an embodiment of the process chamber apparatus.

The term "coupled", as used herein, is defined as connected, although not necessarily directly, and not necessarily mechanically.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

EXAMPLE 1

Preparation of Soft Pellicles Using PTFE

Cross-linked polytetrafluoroethylene (PTFE) is presented in this example as a solution for soft pellicles for 157 nm and previous lithography generations. This material is created using an extremely thin (<25 micron) PTFE that is heated above its melting temperature and irradiated with a high energy electron beam. Adjustments to the film's, properties are completed by variation of temperature, radiation dose, pressure and gas type. These properties include: film thickness, cross-linking density, film uniformity, and degree of crystalinity.

The starting material is mounted onto an aluminum frame in a class 100-1000 clean room and then inserted into a chamber, sealed, and then pressurized to 1.1 atmospheres with high-purity argon. The temperature of the chamber may be varied from 20° C.-400° C., but will generally be operated between 320° C. and 385° C. Prior to heating of the chamber, the system is purged with high purity argon (or other noble gas) for 30 minutes. Under a pressure of 1.1 atmospheres of argon the system is heated to 340° C. The pressure relief valve is set to 1.1 atm thereby preventing over pressurization as heating occurs. During the final heating stage where the system is at equilibrium, vacuum is applied to the system on the order of 20-100 mtorr.

Exposure of the material is carried out through a 32 micron Ti window on the chamber using high energy (~1 MeV) electrons with a total dose of from 800 kGy to 10 MGy. A Gray (Gy) is a Joule per Kilogram. The samples are then cooled slowly to room temperature over a period of two-four hours while maintaining vacuum within the system. After the samples are fully cooled, high-purity argon (or other noble gas) is again flushed through the system and a slight positive pressure (1.1 atm) is maintained using a pressure relief valve.

During the electron beam irradiation procedure double bonds are introduced into the polymers. Exhaustive fluorination is required to eliminate these double bonds and improve the transparency at 157 nm. This fluorination procedure will take place in the same chamber as used for the irradiation. The Ti window will be replaced by an Aluminum (Al) window for this process.

Figure 1:
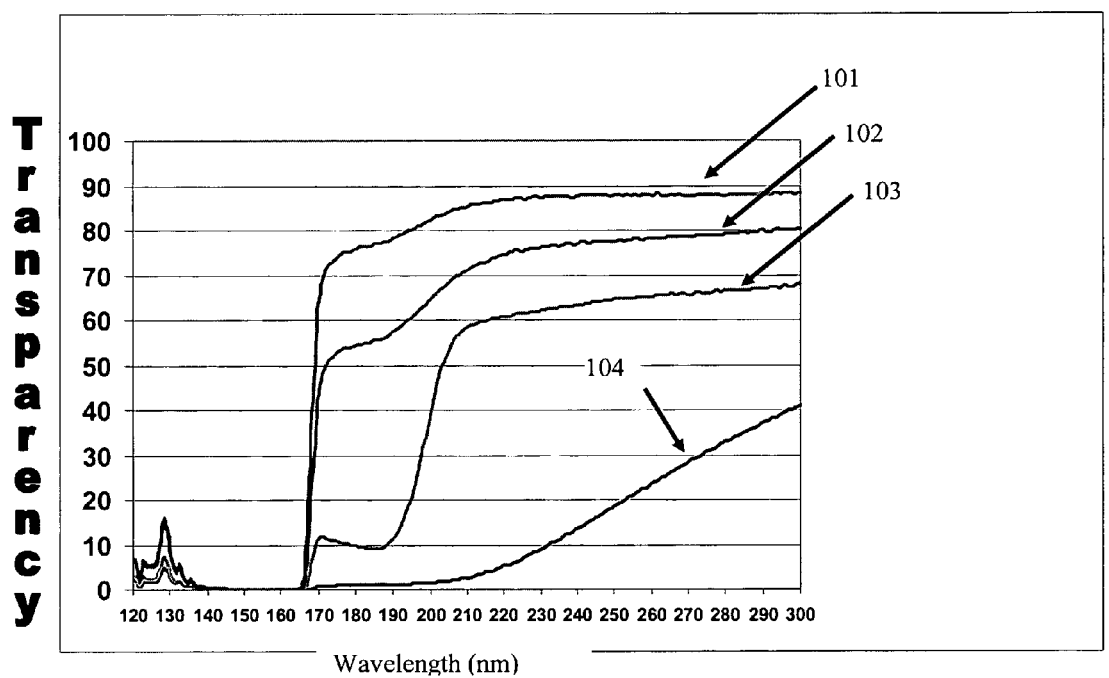
FIG. 1: is a graph showing improvements in the transparency of PTFE as a result of exposure to a high energy electron beam and fluorination in accordance with aspects of the invention.

The results of this procedure are shown in FIG. 1. As shown in FIG. 1, exposure of PTFE to a high energy electron beam ("Ebeam") and/or multiple rounds of fluorination resulted in a significant improvement in the transparency of the perfluorinated polymer. Element 104 is PTFE that has been neither exposed to a high energy electron beam nor fluorinated. Element 103 is PTFE that has exposed to a high energy electron beam. Element 102 is PTFE that has been exposed to a high energy electron beam and been through one round of fluorination. Element 101 is PTFE that has been exposed to a high energy electron beam and been through two rounds of fluorination.

The materials shown in FIG. 2, as well as any perfluorinated polymer, can be used in various embodiments of the present invention, such as 157 nm and 193 nm soft pellicles. Although two-dimensional structures are shown in FIG. 2, three-dimensional structures should be envisioned.

Figure 3:
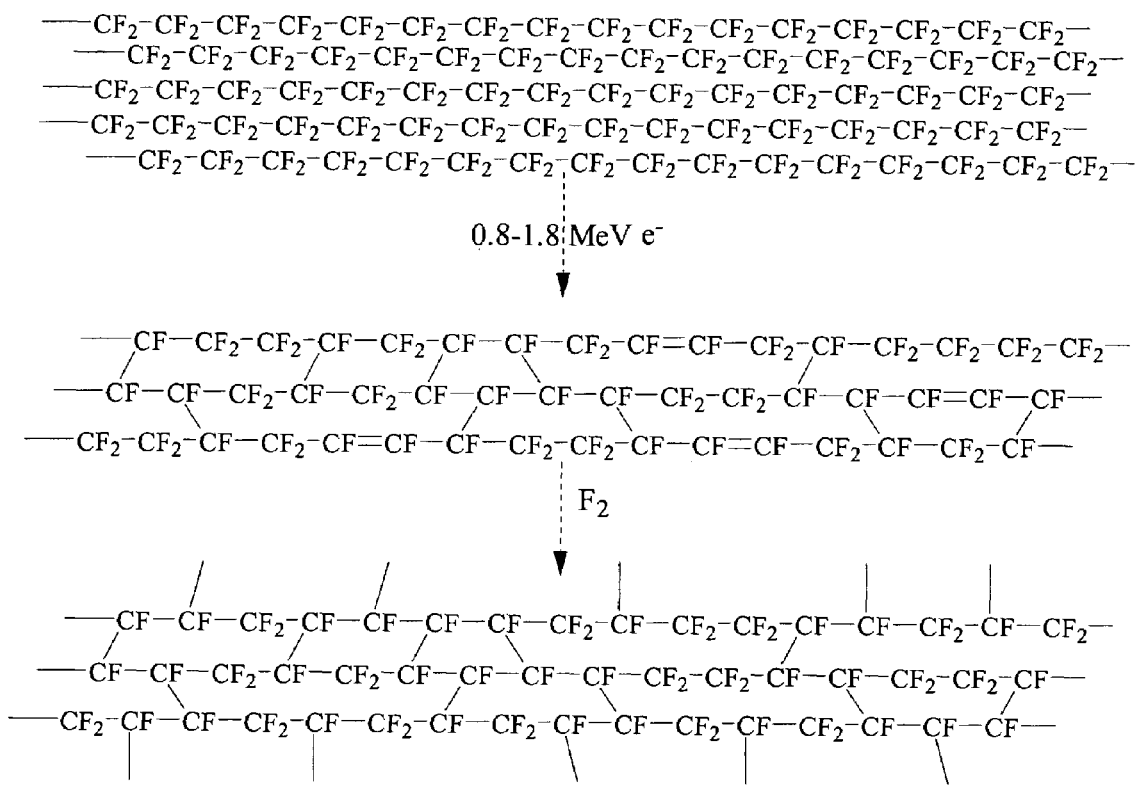
FIG. 3: is an example of typical processing conditions in accordance with aspects of the invention.

The substitution of the windows will be done in a clean room The fluorination process is described in detail in (Chimia, 1985). Once this treatment is completed, the membranes can then be remounted on frames for testing if necessary. However, it is hoped that remounting of the materials is not necessary. FIG. 3 provides a conceptual diagram of the process of irradiation and fluorination. A conceptual embodiment of typical processing conditions is illustrated in FIG. 3. Perfluorinated polymers are preferably exposed to high energy electrons at melt temperature.

The advantage of this process over current materials is that the starting material is inexpensive and readily available from multiple sources. Additionally, the electron bombardment is relatively inexpensive since it requires short irradiation periods of 100-200 seconds. At a cost of $400/hr, 75 membranes/hr could be prepared making the process economically feasible. The fluorination process will likely add another $25-50/membrane. The total estimated cost for these membranes will be on the order of $150-$200/pellicle. Currently the cost of 193 nm pellicles are about $450.00/membrane and 157 nm pellicles are expected to cost significantly more.

EXAMPLE 2

Process Chamber Apparatus

A process chamber apparatus (or "polymer exposure system" apparatus) was created to allow irradiation and fluorination of perfluorinated polymers in the same chamber. FIG. 5 illustrates an embodiment of the process chamber apparatus. Direct fluorination may be accomplished in the same chamber as shown in FIG. 5, and this chamber allows for the introduction of gasses or vacuum.

Element 501 (FIG. 5) is the base chamber (e.g., a chamber made of aluminum) in which the electron beam irradiation of the polymer films will occur. The block may be composed of aluminum and, in a preferred embodiment, measures 254 mm×330 mm×150 mm. Element 502 is a supporting rod in the base chamber. In this embodiment, there are two supporting rods and they are composed of aluminum. Element 503 shows cylindrical openings that house 2000 W-heating elements that can be connected to a controller for power regulation. In this embodiment, there are ten 2000 W heating elements. These heating elements allow the temperature to be controlled between from about 20 to about 400° C. ±3° C. Element 504 shows holes for thermocouples.

Element 505 (FIG. 5) is a hole mounting for a Conflat fitting with control valves. In this embodiment, there are two hole mountings. These hole mountings may be used as a passage for gas and for the regulation of pressure. The two hole mountings in the center on the sides of the base chamber can support two feed through hat assemblies (as shown in FIG. 6). The hat assemblies (as shown in FIG. 6) contain a thermocouple, a pressure relief valve and a shutoff valve. The hat assembly will allow the control of pressure and will allow the chamber environment to be isolated during transport.

Element 506 shows pellicle frames. Multiple pellicle frames may be mounted atop one another on Element 501, with Element 502 holding the frames in place. The pellicle frame may be used during irradiation. In this embodiment, each frame is about 4 mm thick. Polymer films are preferably mounted between two frames and then secured using screws. The frames may be inserted in the chamber with 2 mm spacers put between each frame to prevent the chance of differential pressure.

Element 506 (FIG. 5) shows the pellicle frame that will be used during irradiation. Each frame is about 4 mm thick. Polymer films will be mounted between two frames and then secured using screws. The frames are then mounted on aluminum guide rods in the chamber as shown in FIG. 5 Element 502. The frames are inserted in the chamber with 2 mm spacers put between each frame to prevent the chance of differential pressure. The frames are then mounted on aluminum guide rods in the chamber.

Element 507 (FIG. 5) is an insert which may be mounted atop of Element 506 and Element 501. In this embodiment, the insert is made of stainless steel, although other materials such as aluminum may be used.

Element 508 (FIG. 5) shows the window. In this embodiment, the window is about 290 by about 180 mm and about 32 microns thick and is made of titanium (Ti); however, it is recognized that the window may be made of a material other than Ti. The Ti window is where the electrons will pass through the top of the chamber to modify the perfluorinated polymer films. The Ti window is made of Ti foil. Ti foil is an expendable item that can be replaced when compromised. Element 508 may be mounted upon Element 507.

Element 509 (FIG. 5) is a copper gasket. It is recognized that the gasket could be made of other materials. Element 509 may be mounted upon Element 508.

Element 510 (FIG. 5) is the cover plate flange, which in this embodiment is made of stainless steel. Element 510 can be mounted atop of Element 509 directly to Element 501. This flange can create a seal so that the system may maintain vacuum or a slightly higher than atmospheric pressure.

FIG. 6 shows an embodiment of a custom hat assembly. The hat assembly contains a thermocouple, a pressure relief valve and a shutoff valve. This hat assembly allows the control of pressure and will allow the chamber environment to be isolated during transport. Element 601 is a 338 flange. Element 602 is 133 mini's (3 each). Element 603 is FETC. Element 604 is swaglock fittings. Element 605 is a BVV-025 bakeable valve.

EXAMPLE 3

Preparation of Soft Pellicles Using Perfluorinated Polymers

For several years there has been substantial research into the development of a soft pellicle solution for 157 nm lithography and an improved pellicle for 193 nm lithography. A pellicle is a thin, transparent and passive film that protects the reticle (mask plate) from having particles deposited and thus imaged on to the wafer. Companies with extensive backgrounds in fluoropolymer development have spent years and a large amount of resources in an attempt to meet the requirements for a 157 nm and 193 nm soft pellicles. Materials developed for use as soft pellicles have shown remarkable transparency, however, none of these materials have been able to survive under 157 nm irradiation for any significant time (Feiring et al., 2003; Matsukura et al., 2002). Materials for 193 nm lithography are available but show shorter lifetimes than expected and sometimes have problems such as particle production. Research conducted over the past few years has investigated several model systems and polymers to gain an understanding of how systems are breaking down during 157 nm and 193 nm exposures (Zimmerman et al., 2003; Kuo et al., 2003; Luinov et al., 2004. Additional, work on development of a soft pellicle (Tregub et al., 2003; Liberman et al., 2003) has provided further evidence indirectly supporting possible structural components that may allow the creation of a 157 nm soft pellicle material.

Among the rules that were derived from the work discussed above are:
1. Polymer systems need cross-linking, rings, heteroatoms, or branching to break up σ-conjugation thereby improving transparency (Source French et al. Dupont)
2. Exclusion of all bonded hydrogen from the polymer structure
3. Exclusion of any five or six member rings containing oxygen from the polymer structure
4. Exclusion of any large ($\geq$C4) pendent groups from polymer structure
5. Creation of a structure that does not materially change the composition of the polymer during the formation of free radicals and their subsequent termination Based on this list two structures were determined to be of highest interest. FIG. 2 (top and bottom) shows examples of the structures of the proposed materials of interest for 157 nm. The first proposed structure uses only carbon and fluorine in its composition (FIG. 2, top). The second structure uses oxygen as a heteroatom to help reduce the σ-conjugation on the polymer further (FIG. 2, bottom). Although these structures are drawn as two-dimensional polymers, three-dimensional polymer systems should be envisioned. Of course when you envision these polymers the complexity of synthesizing such systems will also come to mind. Several previous studies have shown the capability to induce cross-linking polymer species using high-energy electrons (Lovejoy et al., 1965; Oshima et al., 2001; Lappan et al., 2001).

Experimental: The starting materials for the synthesized films were obtained from Saint-Gobain Performance Plastics (Wayne, N.J. 07470). The films used were ~7 μm polytetrafluoroethylene (PTFE), ~12 μm fluorinated ethylenepropylene (FEP) and Perfluoroalkoxyalkane (PFA). The films thicknesses were confirmed using a Metrocon analysis. The films were irradiated using 800 KeV electrons using an electron beam accelerator at Electron Beam Technologies Inc. (Kankakee, Ill.). The irradiation was carried out using a vessel shown in FIG. 5. The vessel allows for the introduction of an inert atmosphere and temperature control up to 400° C. For this set of experiments Argon (Air Products) was used at a slight positive pressure. The temperature used corresponded to the melt temperature of the polymer film. All films were mounted in frame and were free standing and were maintained as free standing during the irradiation process. The film was exposed to five-second sweeps of electron irradiation up to doses of several MGy (J/kg).

After Irradiation the films were exposed to a mixture of fluorine and nitrogen gases from Air Products. Both gases were used without further purification. Electronically controlled flow control valves regulated the flow rates of both gases. Excess fluorine was passed through an alumina oxide column prior to venting to the atmosphere. The reactor containing the irradiated films was placed inside a hood and ¼ inch Teflon lines were connected to the inlet and outlet ports via Swagelok connections. The reactor was purged with $N_2$ for 1 hour at a flow rate of 125 cc/min, after which time the $N_2$ flow rate was set to 25 cc/min and the $F_2$ flow rate was set to 10 cc/min. Films were exposed to the gas mixture for from 4 to 26 hours. After the fluorine was turned off, the $N_2$ flow rate was again set to 125 cc/min and the reactor was left to purge overnight.

The exposed films were characterized using several analytical techniques. The FTIR spectra were obtained from a Nicolet Magma-560 FTIR (Thermo Nicolet Corp. Madison, Wis.). The VUV-spectra were obtained from an Acton CAMS-507 spectrophotometer (Acton Research Corp. Acton, Mass.). Exposures of the films to 157 nm and 193 nm light were completed at MIT/LL. The 157 nm exposure was performed in a nitrogen purged environment. The incident energy and the transmitted energy were monitored using pyroelectric detectors and a ratiometer was used to measure the in situ variation of the relative sample transmission verses laser radiation dose. The procedure has been discussed in greater detail elsewhere (Liberman et al., 2002).

Figure 7:
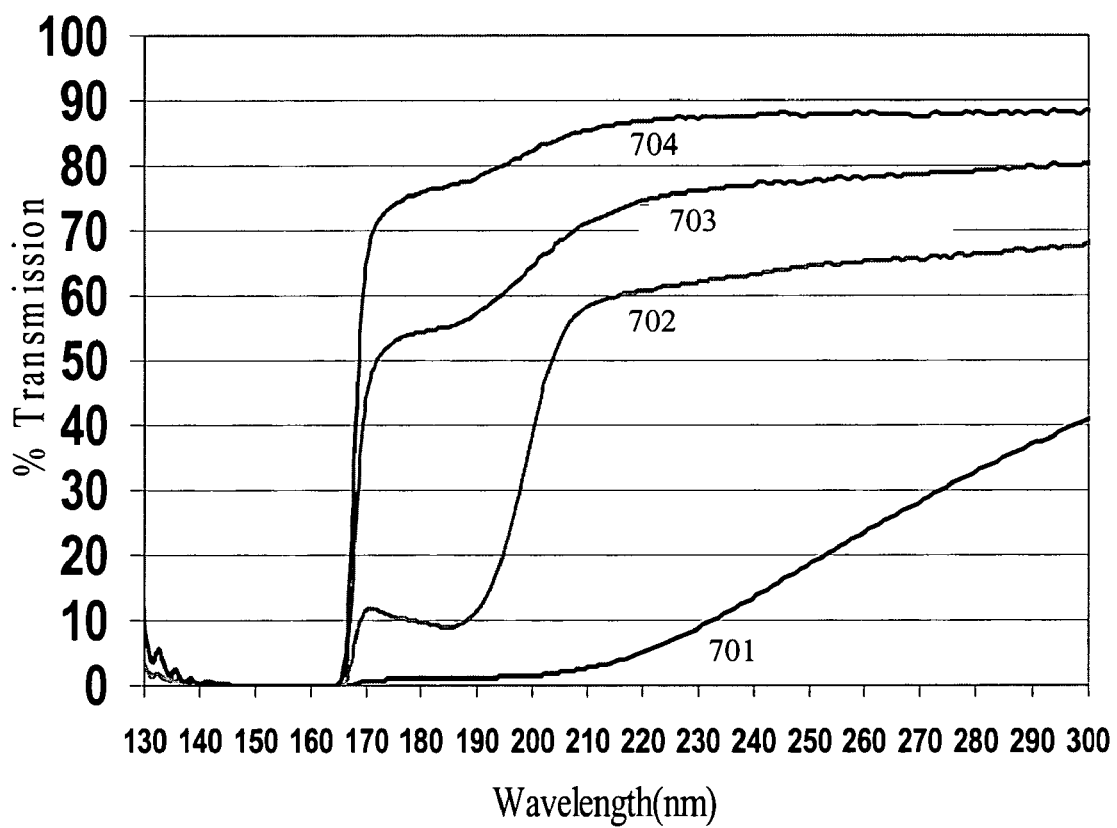
FIG. 7: is a graph of UV Transmission obtained from modified and unmodified PTFE films in accordance with aspects of the invention.

Film Characterization: FIG. 7 shows the UV transmission spectrum for unmodified PTFE and modified PTFE. As shown in FIG. 7, irradiation and/or fluorination improved the transmission characteristics of the films. Element 701 is control PTFE that has not undergone fluorination or irradiation. Element 702 is PTFE that has undergone a 3.5 MGy irradiation. Element 703 is PTFE that has undergone a 7 MGy irradiation. Element 704 is PTFE that has undergone a 7 MGy irradiation and two rounds of fluorination.

The control PTFE film shows poor transmission in the UV due to scattering caused by its intrinsic crystallinity. The control film was about 6.5 microns thick and during this work we were careful to follow some previous procedures on thicker materials[9,10] so as to maintain the thickness of the starting materials. This is also the first study doing irradiation with freestanding and very thin (<20 micron) films.

The results indicate that the transmission from >167 nm can be dramatically affected by variation of irradiation dose for PTFE. An additional improvement in transparency can be realized through a fluorination step. FTIR analysis shows that after the fluorination, peaks corresponding to double bonds are eliminated from the spectrum. XRD analysis of the exposed films indicates that the crystallinity has been eliminated and that the films are now completely amorphous. Experiments show that additional irradiation or fluorination fails to shift the transmission cutoff to shorter wavelengths. There are several possible reasons for this cutoff. It is possible that the starting material has been formulated containing species that have a high intrinsic absorbance in the UV below 170 nm. Another possibility is the possible presence of an absorbing trace additive or contaminant in the base material. This additive may be typical for all PTFE grades and has no impact on standard uses but since this use for PTFE was not intended so no care would be taken to eliminate any UV absorbing species. Alternatively, the sharp cutoff could be due to the nature of the bonds formed in the cross-linked PTFE. We are currently trying to obtain "electronic grade" fluoropolymer film to narrow down the possibilities of what is causing such a severe UV cutoff.

Figure 8:
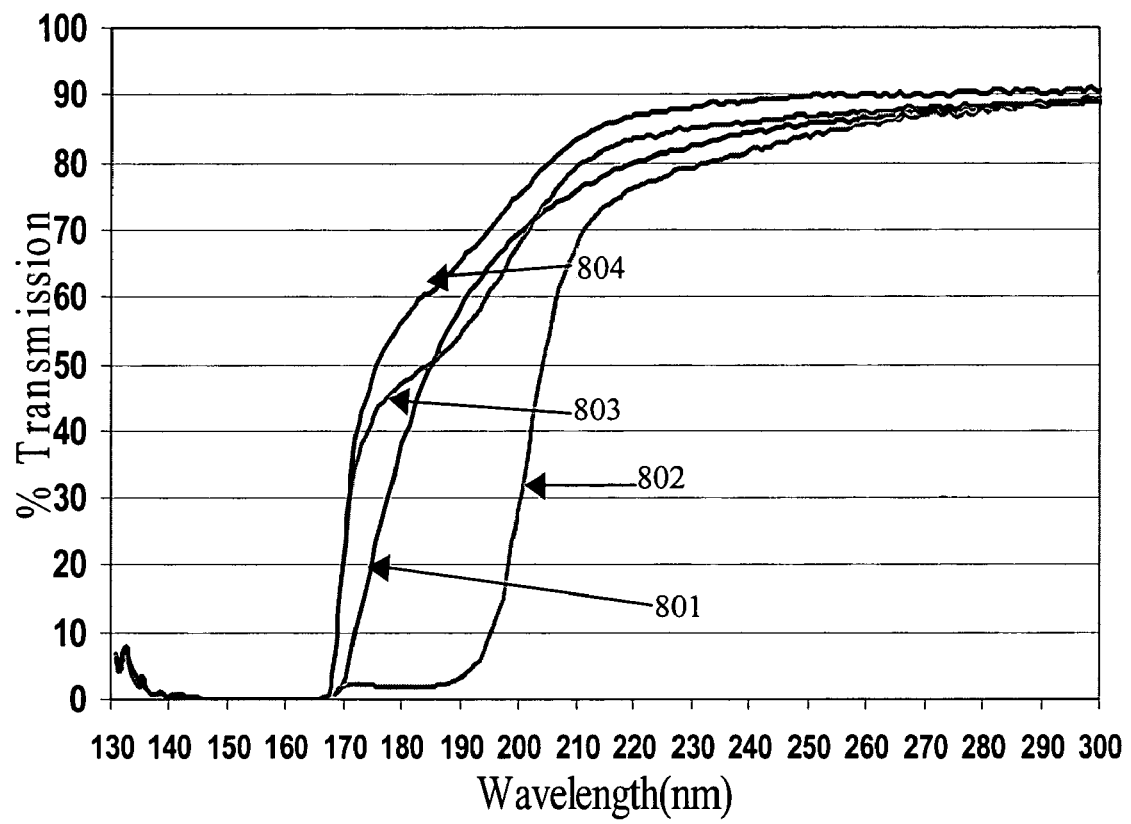
FIG. 8: is a graph of transmission obtained from modified and unmodified PFA films in accordance with aspects of the invention.

Similar work was conducted on FEP and PFA polymer films. FIG. 8 shows the transmission obtained from modified and unmodified PFA films. As shown in FIG. 8, irradiation and/or fluorination improved the transmission characteristics of the films. Element 801 is control PFA that has not undergone irradiation or fluorination. Element 802 is PFA that has undergone 3.5 MGy irradiation. Element 803 is PFA that has undergone 3.5 MGy irradiation and 4 hours of fluorination. Element 804 is PFA that has undergone 3.5 MGy irradiation and 24 hours of fluorination.

Here the PFA film is 13 microns thick which will contribute to the inferior quality of the transmission observed. Interestingly, however, the cutoff at 167 nm is identical in position to that observed by PTFE. The lower overall transmission of the PFA film is due to the increased thickness of the film.

It should be noted, however, that the initial irradiation of the PFA causes a dramatic decrease in transmission between about 170 nm and 270 nm. A similar effect was seen with a low dose (~3.5 MGy) exposed film of FEP. This effect was not observed with a FEP film that was irradiated with a high (~7.0 MGy) dose. Again with FEP, the UV cutoff of the film was observed here at about 167 nm.

Another consideration transmission is not better below 170 nm may be because there are not enough crosslinks to fully disturb the σ-localization. If we use the following:

Assume the yield of Crosslinks for the films=G(X)=3 (where G(X) can be 1-5)

Dose: 1 MGy=100 MRad

The number of events per 100 units=G(X)*MW(g/mol) *Dose (MRad)*1.036×10−6*100%=3*50*100*1.036×10− 6*100=1.55 CF2 units per 100 involved in crosslinks Therefore at a dose of 7 MGy there will be a crosslink every 100/1.55/7~9.2 units.

This is of course just an approximation based on equations from O'Donnell and Sangster (O'Donnell and Sangster, 1970). However if we assume to first order that it is a reasonable approximation that indication are that we need a much higher crosslinking density if we are to eliminate the impact of σ-conjugation on absorption.

Figure 9:
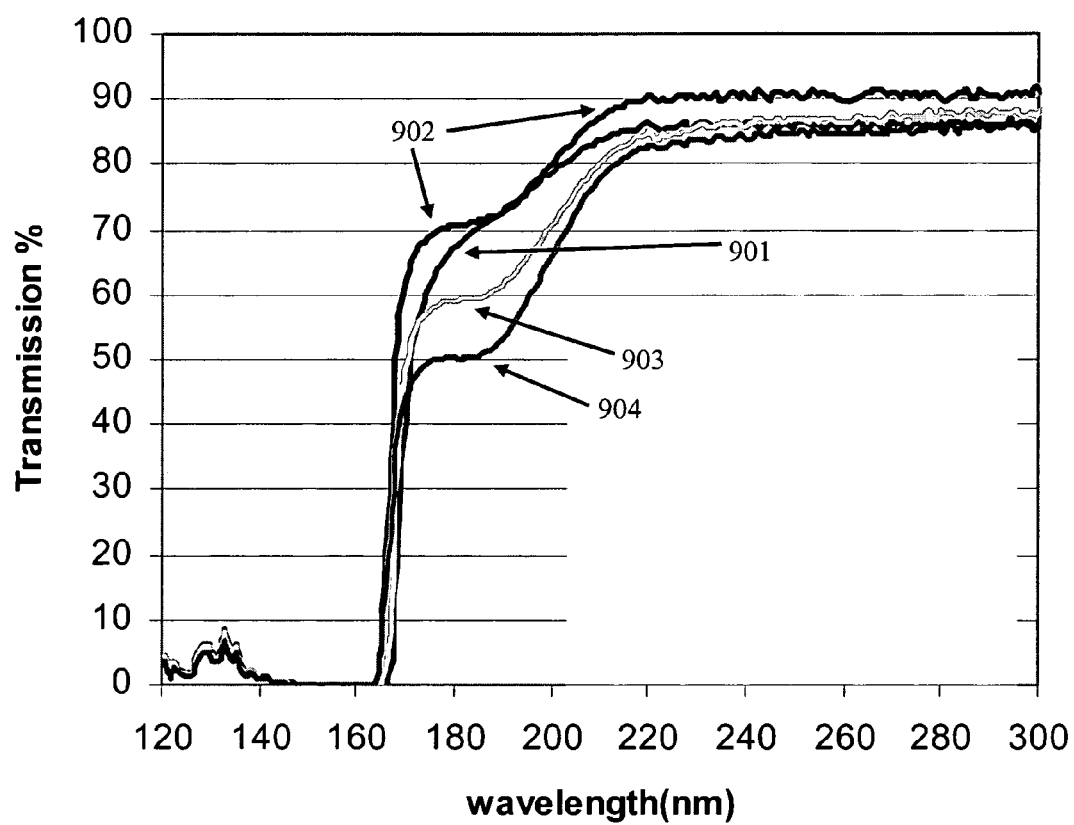
FIG. 9: is a graph of transmission verses wavelength for e-beam modified PTFE films in accordance with aspects of the invention.

FIG. 9 shows the impact that increased doses have on the transmission of a modified PTFE film. Transmission verses wavelength for e-beam modified PTFE films is illustrated in FIG. 9. Element 901 is a PTFE that has been irradiated for 5 minutes resulting in a 3.4 MGy/cm$^2$ exposure. Element 902 is a PTFE that has been irradiated for 10 minutes resulting in a 6.8 MGy/cm$^2$ exposure. Element 903 is a PTFE that has been irradiated for 15 minutes resulting in a 10.2 MGy/cm$^2$ exposure. Element 904 is a PTFE that has been irradiated for 20 minutes resulting in a 13.6 MGy/cm$^2$ exposure. These results indicates that close to about 7 MGy the transmission maximum may be reached.

Figure 10:
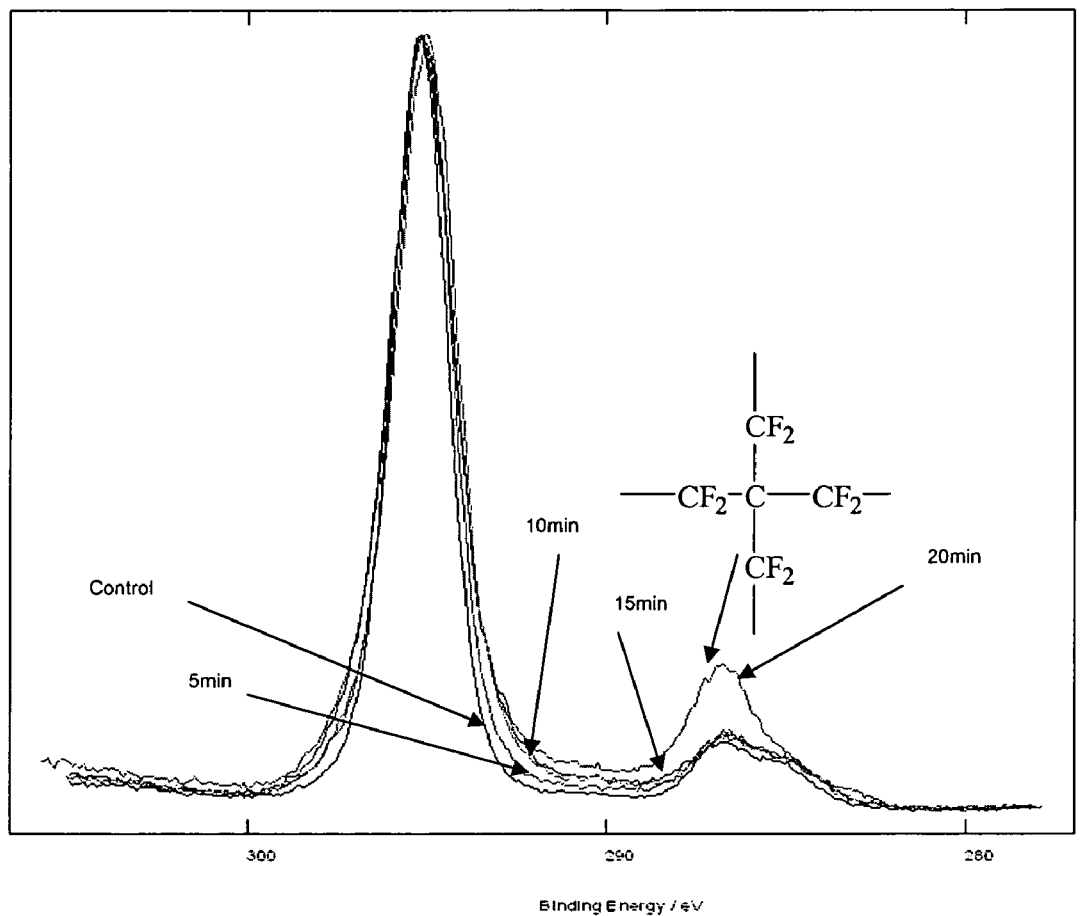
FIG. 10: is a graph of C 1s XPS spectra for PTFE films with differing e-beam exposures in accordance with aspects of the invention.

In fact when the composition of the film was evaluated using XPS, the growth of a peak that is associated with the point of 20 minutes of e-beam exposure was observed. This peak is attributed to a tetrahedral type structure as shown in the FIG. 10. It may be that this particular structure is causing the loss of transmission of the modified PTFE film.

Figure 11:
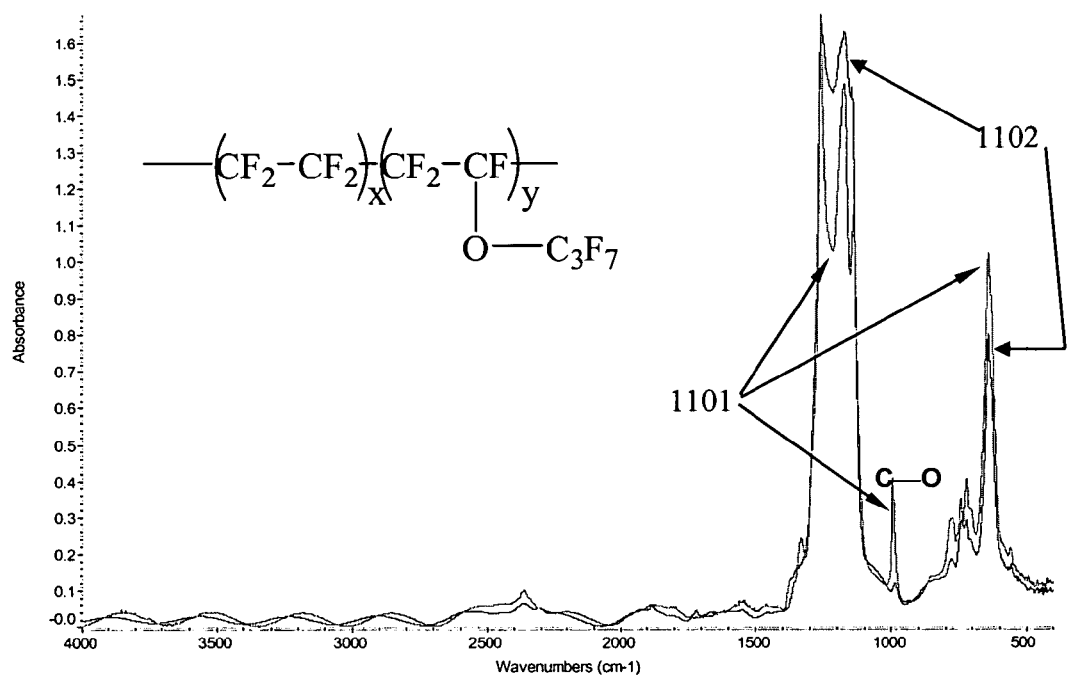
FIG. 11: is a graph of IR spectra for control and irradiated PFA showing the loss of oxygen in accordance with aspects of the invention.

A final consideration in disrupting the σ-conjugation that was considered in this work was to insert a heteroatom in the polymer chain. The test material was PFA and it was hoped that even though only a small amount of O was being added that some impact would be seen and thus would allow a push for developing subsequent material containing significantly more oxygen. Unfortunately the result after irradiation shows that over 90% of the oxygen is loss during the irradiation process. FIG. 11 shows the before and after irradiation spectra for PFA clearly illustrating the loss of Oxygen.

IR spectra for control PFA (Element 1101) and irradiated PFA (Element 1102) indicating the loss of oxygen are shown in FIG. 11. A higher absorbance for the irradiated PFA, as compared to the control PFA, is observed between wave numbers from about 1150 to about 1275. A reduced absorbance is observed for the irradiated PFA, as compared to the control PFA, at about wave number 1000 and wave numbers between from about 500 to about 950.

Figure 12:
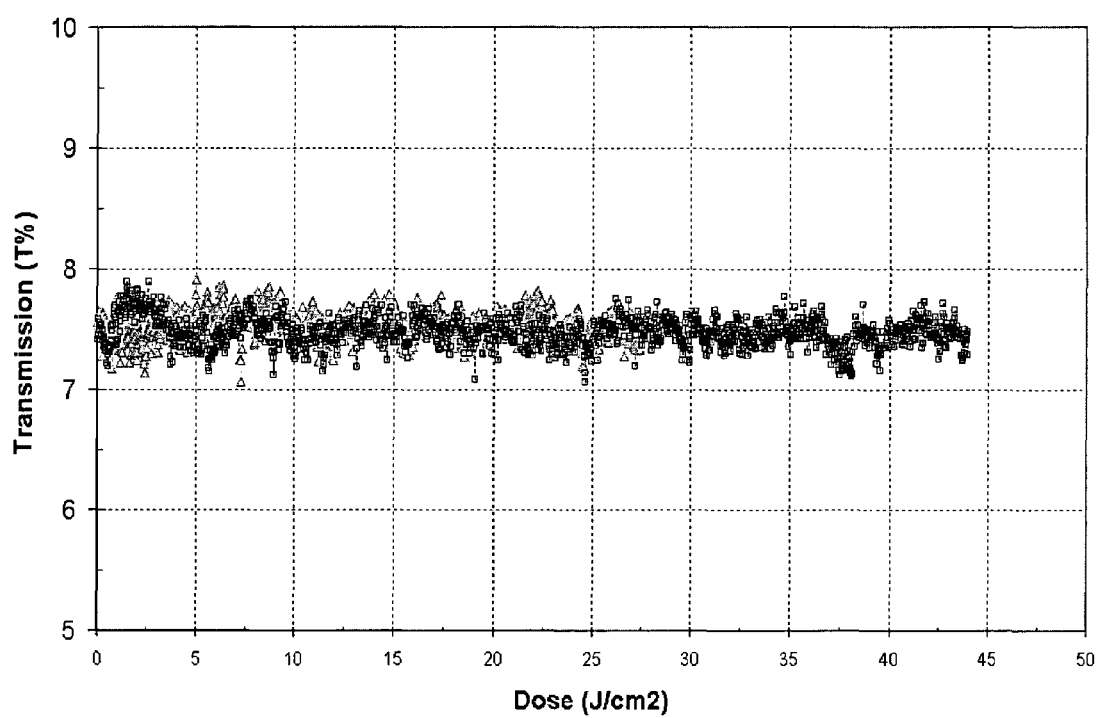
FIG. 12: is a graph of transmission vs. dose for PFA films (grey triangles) and PTFE films (black squares) exposed to 157 nm radiation at 500 Hz in accordance with aspects of the invention.

157 nm and 193 nm Film Exposures. After generation of the prospective soft pellicle materials we sought to test the materials under 157 nm and 193 nm irradiation. Even though the materials tested for transmission at 157 nm appeared completely opaque they were still exposed to 157 nm irradiation. FIG. 12 shows the exposure (transmission vs. dose) for modified PTFE (M-PTFE) and M-PFA films. Transmission vs. dose for PFA films (grey triangles) and PTFE films (black squares) exposed to 157 nm radiation at 500 Hz is shown in FIG. 12. The transmission is still quite low, however, the films were quite robust and suffered no visible change. Chemical analysis of the exposed films concurred with this finding.

Figure 13:
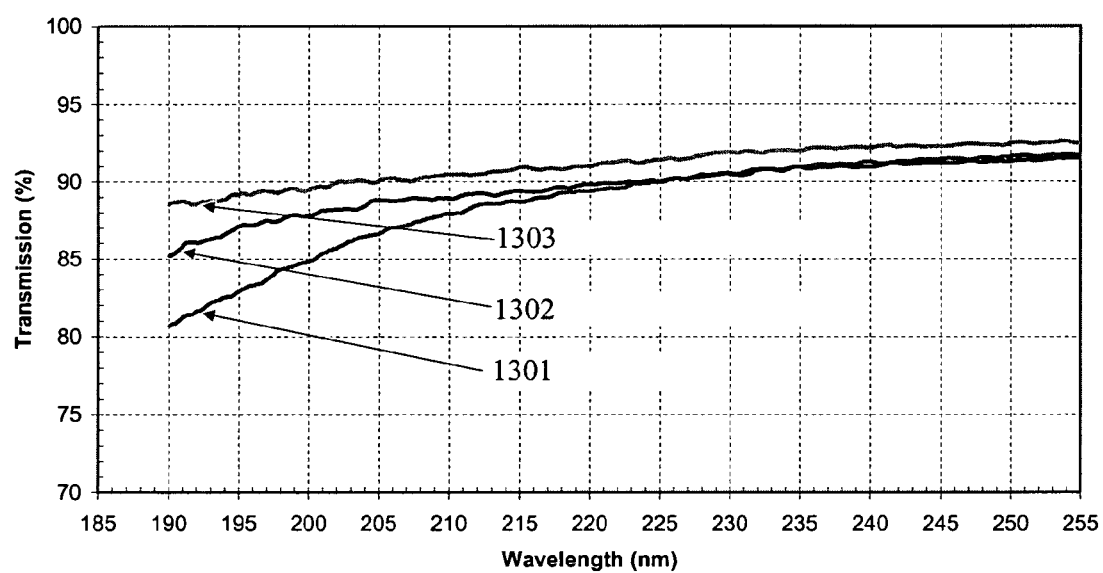
FIG. 13: is a graph of transmission of modified PTFE film after irradiation with a 193 nm laser for various doses in accordance with aspects of the invention.
Figure 14:
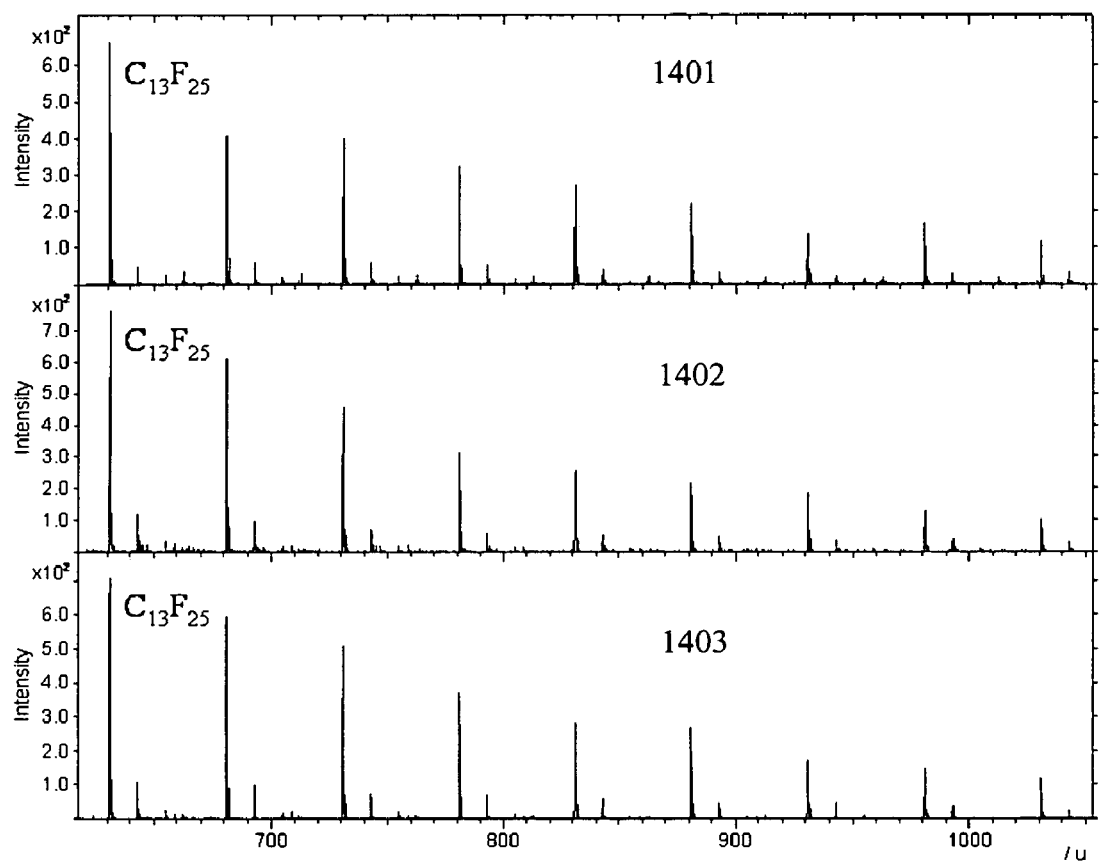
FIG. 14: is a graph of TOF-SIMS comparison of PTFE films in accordance with aspects of the invention.

The transmission observed for M-PTFE, M-FEP and M-PFA at 193 nm indicates that these materials may offer promise for use as a soft pellicle at this particular wavelength. FIG. 13 shows the impact of dose on transparency vs. wavelength for the 6.5 micron PTFE film. Transmission of modified PTFE film after irradiation with a 193nm laser for various doses is shown in FIG. 13. Modified PTFE that was not irradiated (Element 1301), modified PTFE that was exposed to a 756 J/cm² irradiation (Element 1302), and modified PTFE that was exposed to a 3.7 kJ/cm² irradiation (Element 1302) are shown. After extended exposure to 193 nm light the modified polymer films all show significant improvement. It could be considered that the film is being ablated away during the exposure to the laser, however, there are no visible changes to the film even after several kJ of exposure. Further, TOF-SIMS analysis shows that the only difference in the films chemically is that there is less contaminating species present. FIG. 14 shows a comparison between a control, irradiated and an irradiated and exposed PTFE film. TOF-SIMS comparison of PTFE films is shown in FIG. 14. Note that the first peak in each spectrum is the $C_{13}F_{25}$ fragment ion from the PTFE or modified PTFE films. Control PTFE (Element 1401), irradiated PTFE (Element 1402), and irradiated and exposed PTFE (Element 1403) are shown.

Figure 15:
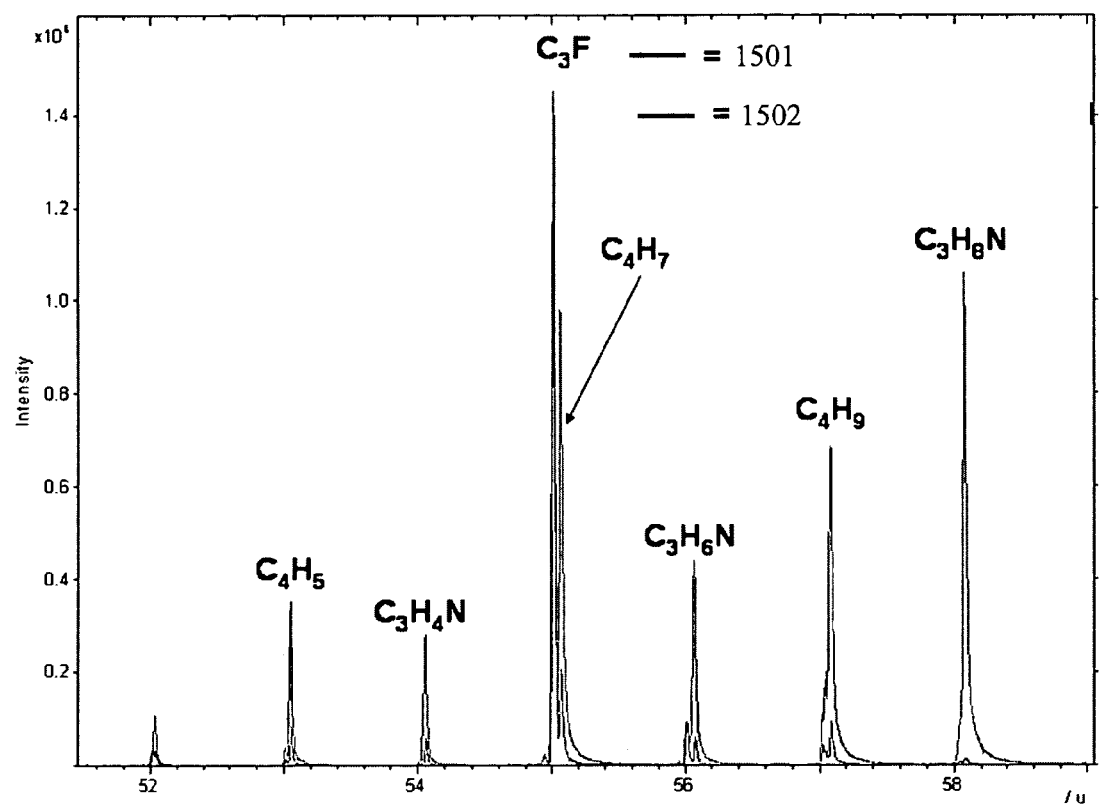
FIG. 15: is a graph of expansion of TOF-SIMS spectra showing the decrease in intensity observed for contaminating organic components on a modified PTFE film that was exposed to a >3 kJ, 193 nm laser in accordance with aspects of the invention.

FIG. 15 shows an expanded area of the spectrum showing the loss of signal from the hydrocarbon species with laser irradiation. As shown in FIG. 15, expansion of TOF-SIMS spectra displayed a decrease in intensity observed for contaminating organic components on a modified PTFE film that was exposed to a >3 kJ, 193 nm laser (Element 1502). The unexposed PTFE film that has been irradiated and fluorinated (Element 1501) shows the presence of significant amounts of organic species. Unlike the unexposed PTFE film, exposed PTFE film shows the presence of the $C_3F$ peak and not the $C_4H_7$ peak. For all of the other peaks on the graph, the exposed PTFE film shows reduced intensities compared to the unexposed PTFE film.

Figure 16A:
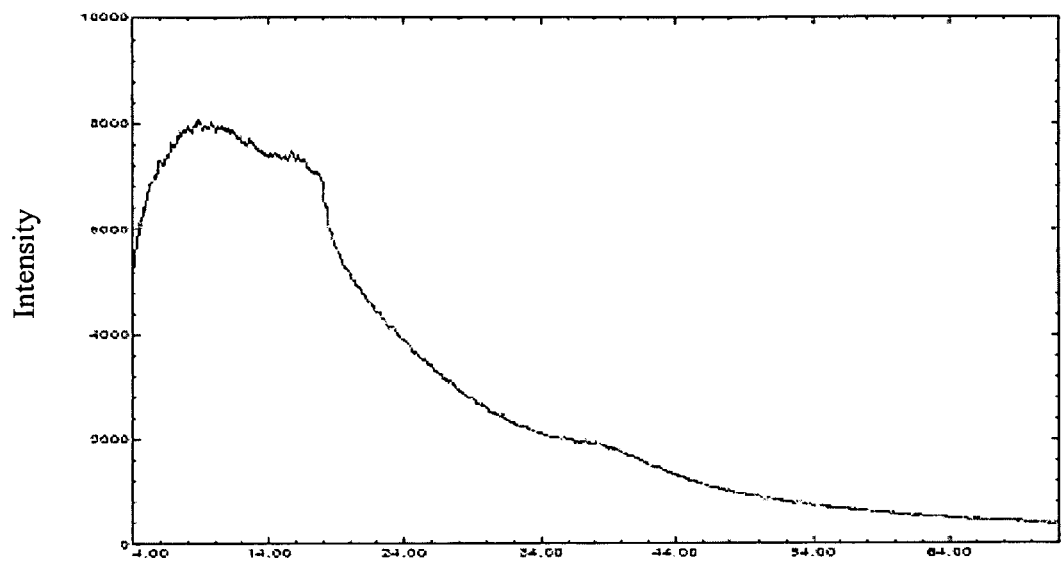
FIGS. 16A-B: are graphs of XRD data of PTFE and irradiated PTFE in accordance with aspects of the invention.
Figure 16B:
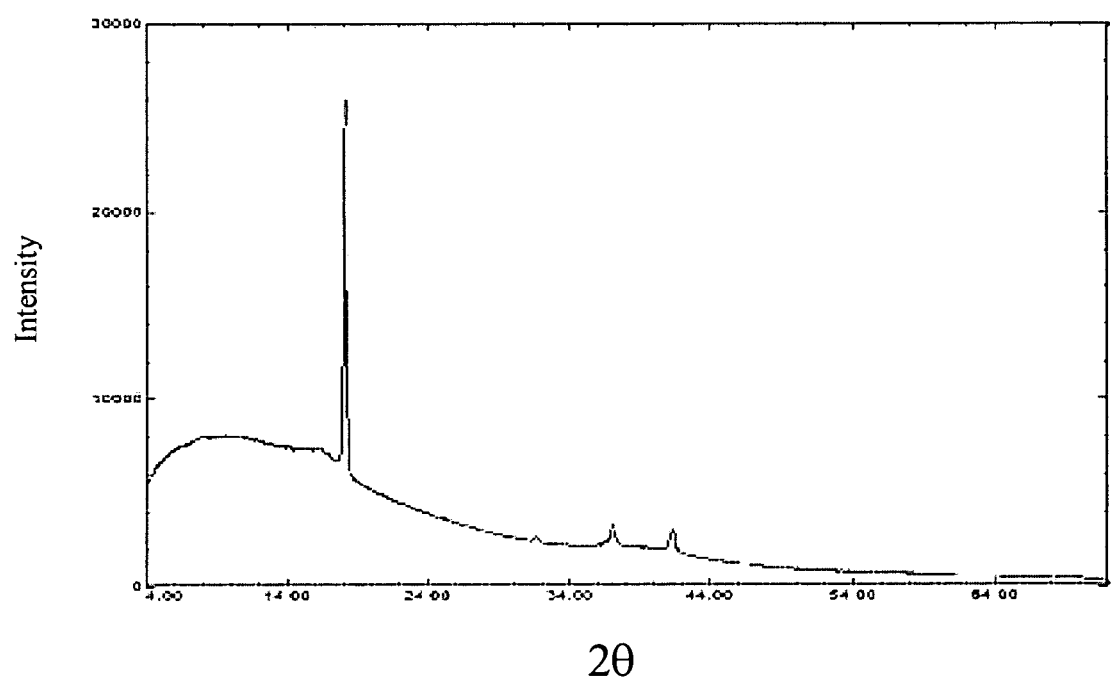

FIGS. 16A-B shows XRD data of PTFE and irradiated PTFE. Irradiated PTFE is shown in FIG. 16A. Control PTFE is shown in FIG. 16B.

Figure 17:
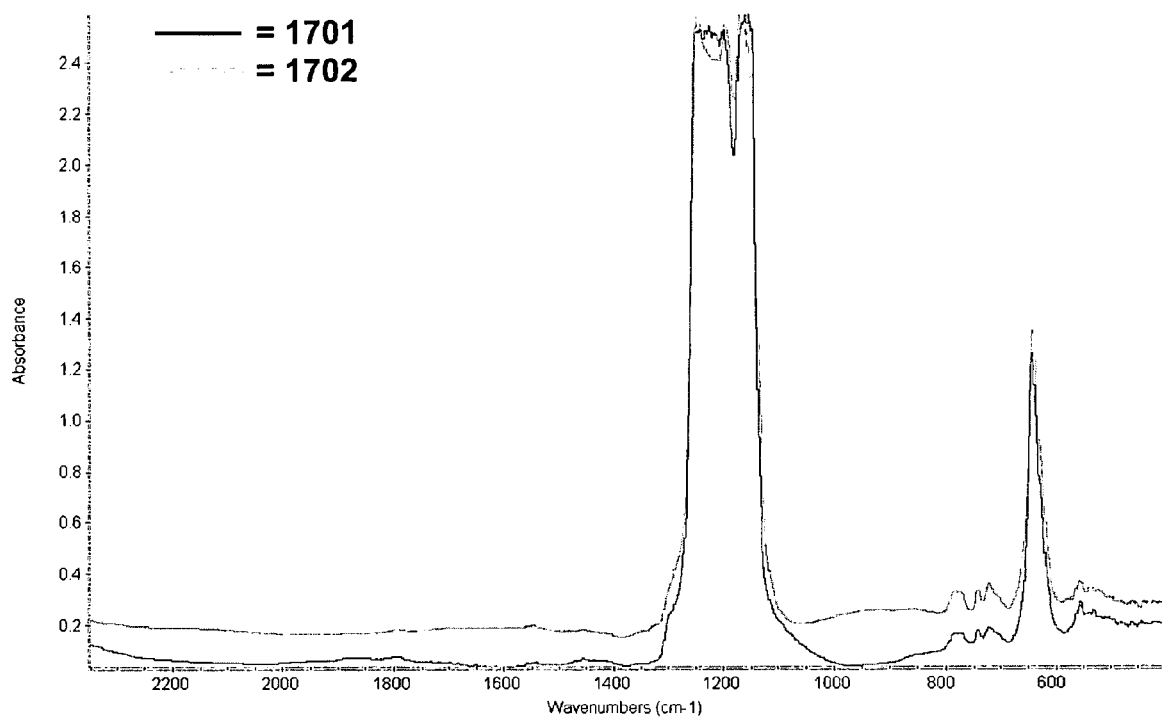
FIG. 17: is a graph of FTIR comparison of PTFE in accordance with aspects of the invention.

FIG. 17 shows FTIR comparison of PTFE. Irradiated and fluorinated PTFE (Element 1702) and control PTFE (Element 1701) are shown.

Figure 18:
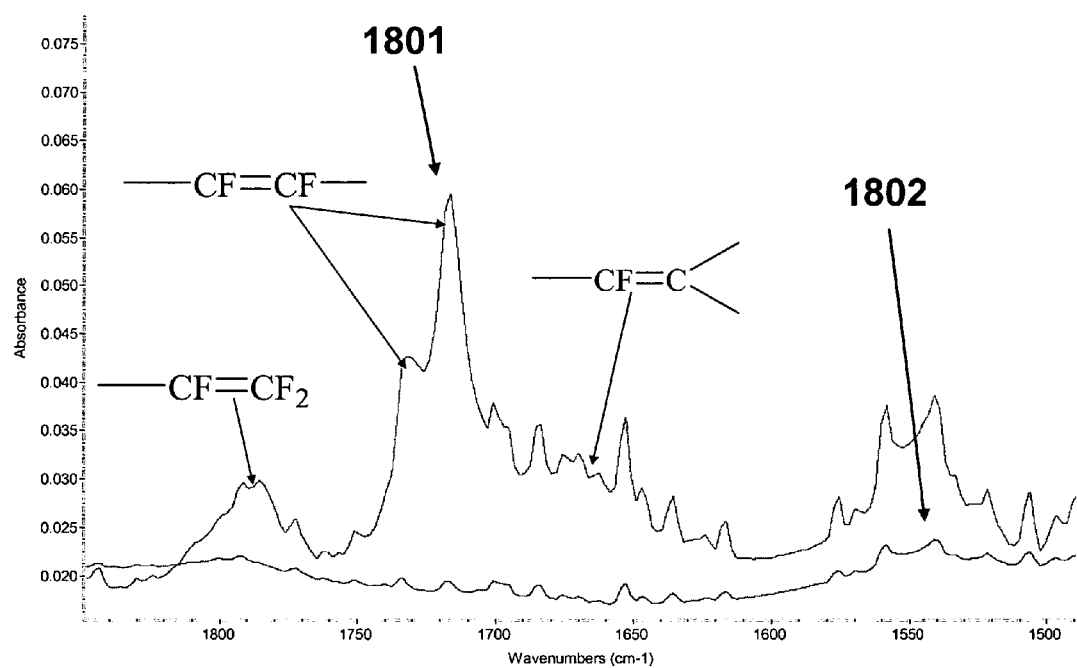
FIG. 18: is a graph of FTIR evaluation of exposed and $F_2$ treated films in accordance with aspects of the invention.

FIG. 18 shows FTIR evaluation of exposed and $F_2$ treated films. Element 1801 is a film which has undergone irradiation. Element 1802 is film which has undergone irradiation and fluorination.

Figure 19:
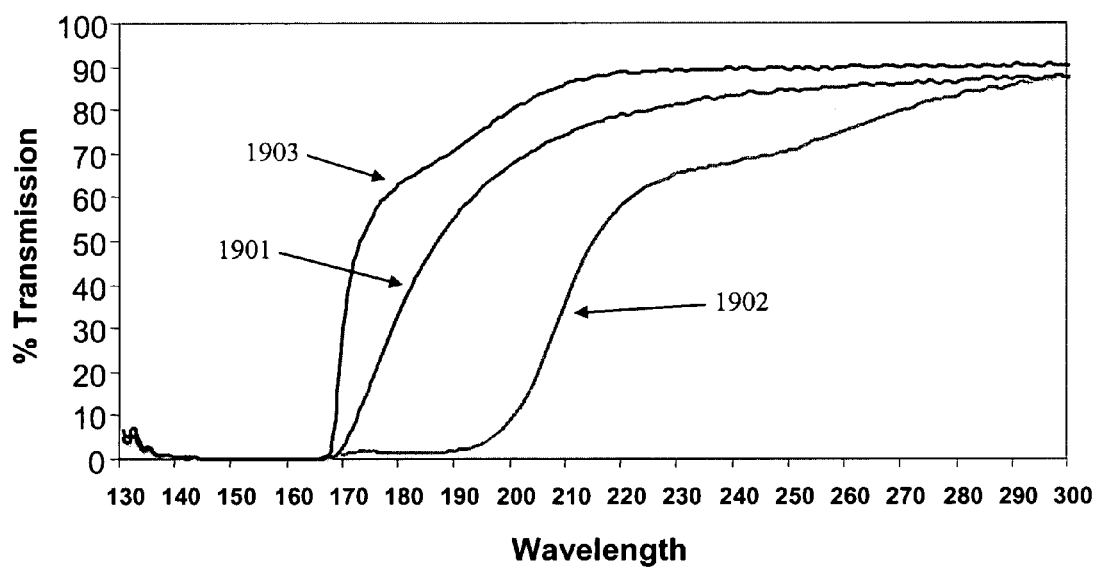
FIG. 19: is a graph of irradiation of FEP films in accordance with aspects of the invention.

FIG. 19 shows irradiation of FEP films. Element 1901 is control FEP that has not undergone irradiation or fluorination. Element 1902 is FEP that has undergone a ~7 MGy irradiation. Element 1903 is FEP that has undergone a ~7 MGy irradiation and fluorination.

Figure 20:
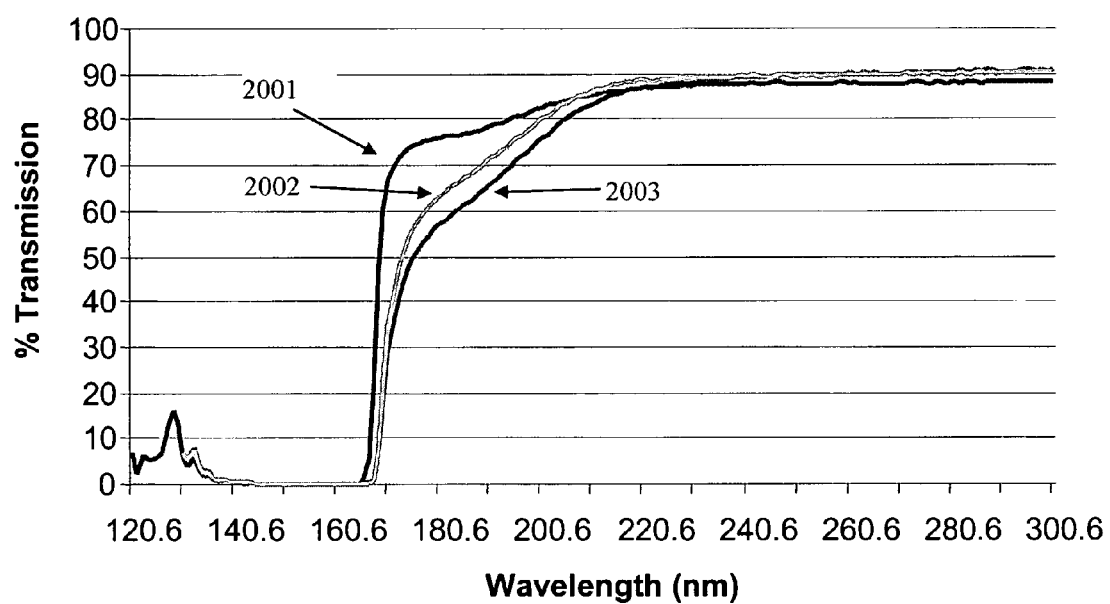
FIG. 20: Comparison of PTFE, FEP, and PFA in accordance with aspects of the invention.

FIG. 20 shows a comparison of PTFE, FEP, and PFA. The % transmission values are shown for PTFE (Element 2001), FEP (Element 2002), and PFA (Element 2003).

Figure 21:
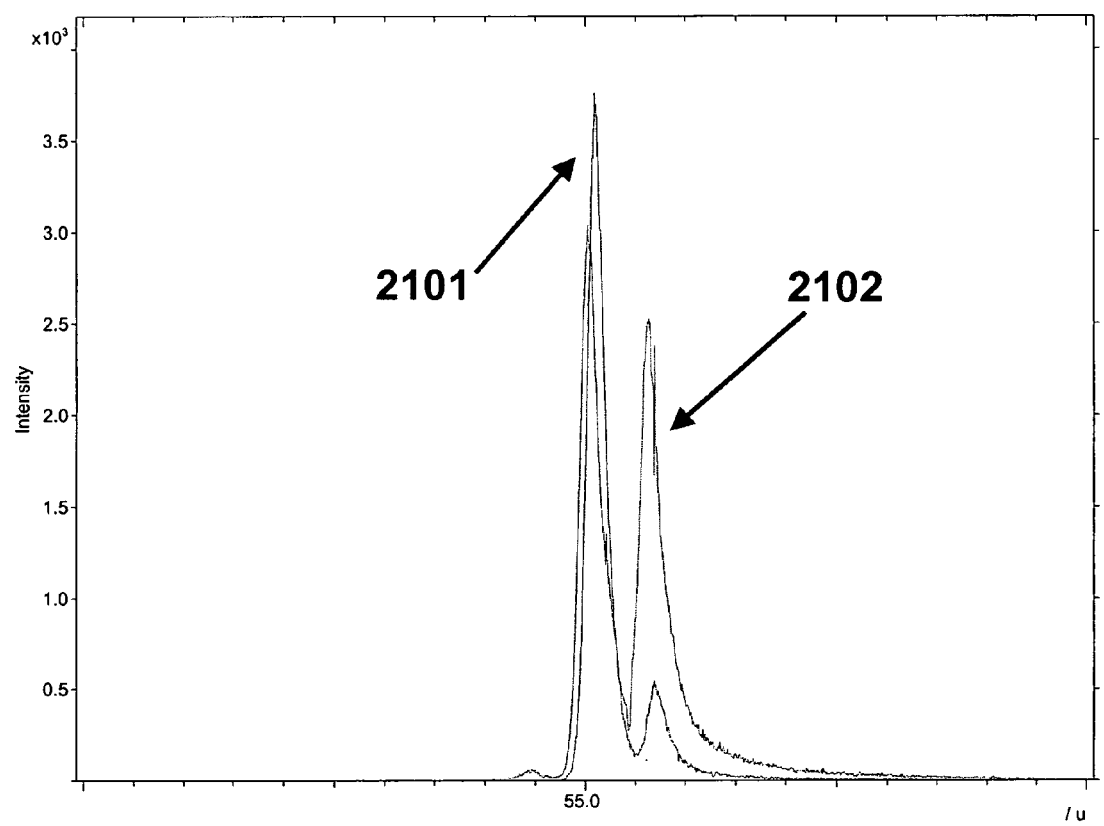
FIG. 21: is a graph of additional TOF-SIMS data of PTFE films in accordance with aspects of the invention.

FIG. 21 shows additional TOF-SIMS data of PTFE films. Irradiated and exposed PTFE (Element 2101) and irradiated and fluorinated PTFE (Element 2102) are shown.

Figure 22:
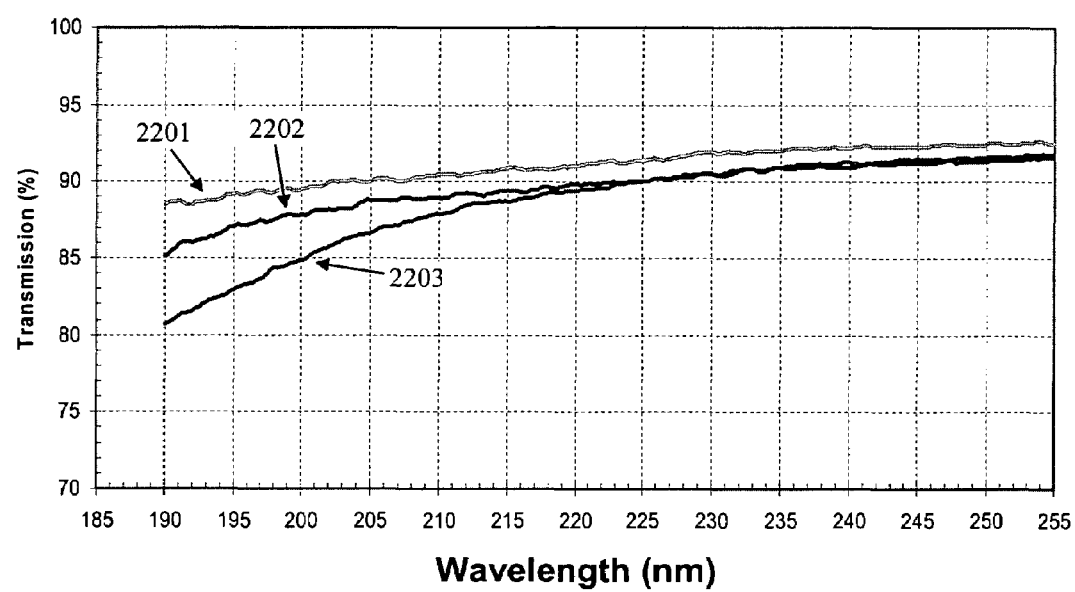
FIG. 22: is a graph of modified PTFE at 193 nm and 248 nm in accordance with aspects of the invention.

FIG. 22 shows modified PTFE at 193 nm and 248 nm. Modified extruded PTFE was evaluated using UV-VIS spectra tested at 193 nm 400 Hz. Data are shown for PTFE film that has not undergone irradiation (Element 2201), PTFE film that has undergone a 756 J/cm² irradiation (Element 2202), and PTFE film that has undergone a 3.7 KJ/cm² irradiation (Element 2203).

In conclusion, thin polymer films can be irradiated using high-energy electrons in an inert atmosphere to create new classes of materials. Irradiation can be used to create completely amorphous polymers from crystalline starting materials. Modification of fluoropolymer films show distinct improvements in transmission from >200 nm to 167 nm and also that the films maintain their robustness after their treatment. These modified films show promise for use as 193 nm soft pellicles. Further, the films used in this Example were made from materials that were of a standard commercial grade. This grade could contain contaminants and polymer chain end-groups limiting the absolute transmission obtained. An electronic grade material that is one micro thick could give transparencies >99% @193 nm. Additionally, increasing the crosslinking density, increasing branch points in the polymer, and/or introducing heteroatoms to further disturb the σ-conjugation may also improve transparency.

All of the compositions and methods and apparatuses disclosed and claimed herein can be made and executed without undue experimentation in light of the present disclosure. While the compositions and methods of this invention have been described in terms of preferred embodiments, it will be apparent to those of skill in the art that variations may be applied to the compositions and methods and apparatuses and in the steps or in the sequence of steps of the method described herein without departing from the concept, spirit and scope of the invention. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated herein by reference.

Chapiro, In: *Radiation chemistry of polymer systems*, InterScience (London), 1962.
Vypiel, *Chimia*, 39:305-311, 1985.
El-Nemr et al., *HAWA* (Egypt), 98:12-16, 1998.
Fischer et al., *Polymer*, 39:573, 1998.
Franklin, *J. Am. Chem. Soc. Lubricat. Engng.*, 38(10):635, 1982.
Ikeda et al., *Proc. Intl. Symp. Prospects Appl. Radia. (PAR21)*, 161-162, 2000.
Katoh et al., *Radiat. Phys. Chem.*, 54:165-171, 1999.
Lappan et al., *Nuclear Instru. Meth. Physics Res. B*, 185:178-183, 2001.
Lappan et al., *Radiat. Phys. Chem.*, 59:317-322, 200b.
Senna et al, *Polym. Degrad. Stabilithy*, 71:53-60, 2000.
Lappan et al., *Radiat. Phys. Chem.*, 59:317-322, 2000a.
Lovejoy et al., *J. Applied Polymer Sci.*, 9:401-410, 1965.
Oshima et al., *Polym. Int.*, 48:996-1003, 1999a.
Oshima et al., *Polym. Int.*, 55:61-71, 1999b.
Oshima et al., *Radiat. Phys. Chem.*, 45:269-273, 1995.
Oshima et al., *Radiat. Phys. Chem.*, 50:519-522, 1997a.
Oshima et al., *Radiat. Phys. Chem.*, 50:601-606, 1997c.
Oshima et al., *Radiat. Phys. Chem.*, 50:611-615, 1997b.
Oshima et al., *Radiat. Phys. Chem.*, 62:39-45, 2001.
Senna et al., *Polymer Deg. Stability*, 71:53-60, 2000.
Sun et al., *Radiat. Phys. Chem.*, 44:655-659, 1994.
Tabata and Oshima, *Macromol. Symp.*, 143:337-358, 1999.
Tabata et al., *Radiat. Phys. Chem.*, 48:563-568, 1996.
Tabata, In: *Solid state reaction in radiation chemistry*, Proceedings of Taniguchi Conf., Japan, 119-120, 1992.
Woods and Pikaev, In: *Applied radiation chemistry and radiation processing*, Wiley & Sons, Inc., NY, 1994.
Yoshi et al., *Polym. Commun.*, 28:278, 1987.
A. E. Feiring, M. K. Crawford, W. B. Farnham, J. Feldman, R. H. French, R. C. Wheland, W. Qiu, M. F. Lemon, E. Zhang, J. Gordon,", J. Fluorine Chem. 122, 63 (2003).
I. Matsukura, N. Shirota, and H. Kuriyama, 3rd International Symposium on 157 nm Lithography in Antwerp, Sep. 4, 2002
P. A. Zimmerman, D. Miller, G. Feit, A. Whittaker, D. Hill, F. Rasoul, H. Liu, I. Blakely, G. George, N. J. Turro, K. Lee, S. Jockusch, A. Proctor, C. Garza, R. H. French and R. C. Wheland 4th International Symposium on 157 nm Lithography in YOKOHAMA, Aug. 27, 2003
Y. Kuo, L. Tewg, P. A. Zimmerman, Proc of SPIE, 23rd Annual BACUS Symposium on Photomask Technology, 5256, 195, (2003)
I. Luzinov, G. Chumanov, V. Klep, D. Evanoff, B. Zdyrko, P. A. Zimmerman, and D. Miller, "Nanoparticle Stabilization of Polymer Pellicles in 157 nm Photolithography", International Symposium on Immersion and 157 nm Lithography Aug. 2-5, 2004 Vancouver, British Columbia.
A. Tregub, F. Eschbach, J. Powers, F. C. Lo, S. Shigematsu and H. Nakagawa, "Development of Fluoropolymer Membranes Transparent and Resistant to 157 nm Exposure", 4th International Symposium on 157 nm Lithography in YOKOHAMA, Aug. 27, 2003
V. Liberman, J. H. C. Sedlacek, T. H. Fedynyshyn, R. B. Goodman, M. Rothschild, and R. Sinta, 4th International Symposium on 157 nm Lithography in YOKOHAMA, Aug. 27, 2003
E. R Lovejoy, M. I. Bro, and G. H. Bowers, "Chemistry of Radiation Crosslinking of Branched Fluorocarbon Resins". J. Appl. Polymer Sci., 9, 411, (1965).
A. Oshima, S. Ikeda, E. Katoh, Y. Tabata, "Chemical structure and physical properties of radiation-induced crosslinking of polytetrafluoroethylene", Rad. Physics and Chem., 62, 39, (2001).
U. Lappan, U Geissler, L. Häussler, D. Jehnichen, G. Pompe, K. Lunkwitz, Radation-induced branching and crosslinking of poly(tetrafluoroethylene) (PTFE)", Nucl. Inst. and Methods in Physics Res. B 185, (2001)
V. Liberman, M. Rothschild, J. H. C. Sedlacek, A. Grenville, R. H. French, Optical Microlithography XV, SPIE 4691, 56, (2002).
J. H. O'Donnell and D. F. Sangster, Principles of Radiation Chemistry, American Elsevier Publishing Company, New York, 1970, p. 166.

What is claimed is:

1. A pellicle for use in a lithographic process, the pellicle comprising a cross-linked perfluorinated polymer PTFE film, the pellicle being substantially transparent to radiation at 193 nm.

2. The pellicle of claim 1, wherein the pellicle has a thickness of less than about 25 microns.

3. A pellicle for use in a lithographic process, the pellicle comprising a cross-linked perfluorinated polymer selected from the group consisting of FEP, PFA, and polytetrafluoroethylene co-perfluoroisobutylene, the pellicle being substantially transparent to radiation at 193 nm.

4. The pellicle of claim 3, the pellicle having a thickness of less than about 25 microns.

* * * * *